US011924597B2

(12) United States Patent
Cho et al.

(10) Patent No.: US 11,924,597 B2
(45) Date of Patent: Mar. 5, 2024

(54) ELECTRONIC DEVICE INCLUDING NOISE DETECTION CIRCUITRY

(71) Applicant: Samsung Electronics Co., Ltd., Suwon-si (KR)

(72) Inventors: Hyoungtak Cho, Suwon-si (KR); Kiwook Han, Suwon-si (KR); Hyunggwang Kang, Suwon-si (KR); Myunghoon Kwak, Suwon-si (KR); Moonsun Kim, Suwon-si (KR); Junhyuk Kim, Suwon-si (KR); Changryong Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 215 days.

(21) Appl. No.: 17/519,985

(22) Filed: Nov. 5, 2021

(65) Prior Publication Data
US 2022/0150613 A1     May 12, 2022

Related U.S. Application Data

(63) Continuation of application No. PCT/KR2021/015788, filed on Nov. 3, 2021.

(30) Foreign Application Priority Data

Nov. 6, 2020   (KR) .................. 10-2020-0147479
Nov. 25, 2020  (KR) .................. 10-2020-0159615

(51) Int. Cl.
*H04R 1/08*     (2006.01)
*G01P 1/00*     (2006.01)
(Continued)

(52) U.S. Cl.
CPC ............... *H04R 1/08* (2013.01); *G01P 1/00* (2013.01); *G01P 15/12* (2013.01); *H04R 1/02* (2013.01);
(Continued)

(58) Field of Classification Search
CPC .. H04R 2499/11; H04R 2499/15; H04R 1/08; H04R 1/083; H04R 1/086; H05K 5/0017;
(Continued)

(56) References Cited

U.S. PATENT DOCUMENTS 9,586,815 B2 *  3/2017  Su ........................... B81B 7/02
9,681,210 B1 *  6/2017  Lippert ................. G10K 11/18
(Continued)

FOREIGN PATENT DOCUMENTS

CN     111262998 A     6/2020
KR     10-1492751 B1   2/2015
(Continued)

OTHER PUBLICATIONS

International Search Report and Written Opinion dated Feb. 10, 2022, issued in International Patent Application No. PCT/KR2021/015788.
(Continued)

*Primary Examiner* — Jason R Kurr
(74) *Attorney, Agent, or Firm* — Jefferson IP Law, LLP

(57) ABSTRACT

An electronic device is provided. The electronic device includes a housing, a flexible display configured to move relative to at least a portion of the housing, and at least one noise detection circuitry disposed in the housing. The at least one noise detection circuitry may include a substrate, a microphone circuitry disposed on the substrate, a vibration detection sensor disposed on the substrate, a shielding member disposed on the substrate and surrounding at least a portion of the vibration detection sensor, and a waterproofing member disposed on the shielding member and covering the vibration detection sensor.

19 Claims, 22 Drawing Sheets

(51) Int. Cl.
*G01P 15/12* (2006.01)
*H04R 1/02* (2006.01)
*H05K 5/00* (2006.01)
*H05K 5/02* (2006.01)

(52) U.S. Cl.
CPC ......... *H05K 5/0017* (2013.01); *H05K 5/0217* (2013.01); *H04R 2499/15* (2013.01)

(58) Field of Classification Search
CPC .. H05K 5/0217; H05K 5/0056; H05K 5/0078; H05K 5/0214; G01P 1/00; G01P 15/12
See application file for complete search history.

(56) References Cited

U.S. PATENT DOCUMENTS

| | | | |
|---|---|---|---|
| 2011/0126632 A1* | 6/2011 | McNeil | B81B 7/02 73/718 |
| 2013/0208923 A1 | 8/2013 | Suvanto | |
| 2014/0044297 A1* | 2/2014 | Loeppert | H04R 1/086 381/355 |
| 2014/0112510 A1* | 4/2014 | Yang | H04R 1/021 381/91 |
| 2014/0362020 A1 | 12/2014 | Rothkopf et al. | |
| 2015/0172572 A1 | 6/2015 | Kim | |
| 2017/0125032 A1 | 5/2017 | Sorensen | |
| 2017/0133002 A1 | 5/2017 | Jung | |
| 2017/0318693 A1 | 11/2017 | Kim et al. | |
| 2018/0035208 A1 | 2/2018 | Choi et al. | |
| 2019/0170716 A1 | 6/2019 | Sim et al. | |
| 2019/0278336 A1 | 9/2019 | Choi et al. | |
| 2019/0320050 A1 | 10/2019 | Lim et al. | |
| 2021/0400380 A1* | 12/2021 | Tisch | H04S 1/007 |

FOREIGN PATENT DOCUMENTS

| | | |
|---|---|---|
| KR | 10-2015-0070596 A | 6/2015 |
| KR | 10-2017-0022284 A | 3/2017 |
| KR | 10-2017-0055329 A | 5/2017 |
| KR | 10-2017-0055865 A | 5/2017 |
| KR | 10-2017-0065053 A | 6/2017 |
| KR | 10-2017-0123382 A | 11/2017 |
| KR | 10-2018-0012390 A | 2/2018 |
| KR | 10-2019-0105858 A | 9/2019 |
| KR | 10-2019-0121119 A | 10/2019 |
| KR | 10-2020-0124927 A | 11/2020 |
| KR | 10-2022-0013895 A | 2/2022 |

OTHER PUBLICATIONS

European Search Report dated Jan. 3, 2024, issued in European Application No. 21889547.2.

* cited by examiner

ELECTRONIC DEVICE INCLUDING NOISE DETECTION CIRCUITRY

CROSS-REFERENCE TO RELATED APPLICATION(S)

This application is a continuation application, claiming priority under § 365(c), of an International application No. PCT/KR2021/015788, filed on Nov. 3, 2021, which is based on and claims the benefit of a Korean patent application number 10-2020-0147479, filed on Nov. 6, 2020, in the Korean Intellectual Property Office, and of a Korean patent application number 10-2020-0159615, filed on Nov. 25, 2020, in the Korean Intellectual Property Office, the disclosure of each of which is incorporated by reference herein in its entirety.

TECHNICAL FIELD

The disclosure relates to an electronic device including a noise detection module.

BACKGROUND ART

With the development of information and communication technology and semiconductor technology, various functions are packed in one portable electronic device. For example, an electronic device may have not only communication function but also the entertainment function, e.g., playing games, the multimedia function, e.g., playing music/videos, communication and security functions for mobile banking, and scheduling and e-wallet functions. Such electronic devices become compact enough for users to carry in a convenient way.

As mobile communication services expand up to multimedia service sectors, the display of the electronic device may be sized up to support multimedia services as well as voice call or text messaging services.

The above information is presented as background information only to assist with an understanding of the disclosure. No determination has been made, and no assertion is made, as to whether any of the above might be applicable as prior art with regard to the disclosure.

DISCLOSURE

An electronic device (e.g., a portable terminal) may include a display with a flat surface or both a flat and curved surface. An electronic device including a display may have a limitation in realizing a screen larger than the size of the electronic device due to the fixed display structure. Accordingly, research has been conducted on electronic devices including a foldable or rollable display.

As the structures of an electronic device move relative to each other (e.g., a slide), noise or vibration may be generated. For example, when an electronic device with a bendable display slides, the position of the camera, speaker, or microphone may change, and driving noise and/or vibration may be introduced into the microphone.

Aspects of the disclosure are to address at least the above-mentioned problems and/or disadvantages and to provide at least the advantages described below. Accordingly, an aspect of the disclosure is possible to provide a noise detection module capable of detecting driving noise and/or vibration of an electronic device.

Another aspect of the disclosure is to provide an electronic device that may distinguish between noise and voice using a noise detection module including a microphone module and a vibration detection sensor and may attenuate the noise.

The disclosure is not limited to the foregoing embodiments, but various modifications or changes may rather be made thereto without departing from the spirit and scope of the disclosure.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a flexible display configured to move relative to at least a portion of the housing, and at least one noise detection module disposed in the housing. The at least one noise detection module may include a substrate, a microphone module disposed on the substrate, a vibration detection sensor disposed on the substrate, a shielding member disposed on the substrate and surrounding at least a portion of the vibration detection sensor, and a waterproofing member disposed on the shielding member and covering the vibration detection sensor.

In accordance with another aspect of the disclosure, a noise detection module is provided. The noise detection module includes a substrate, a microphone module disposed on the substrate, a vibration detection sensor disposed on the substrate, a shielding member disposed on the substrate and surrounding at least a portion of the vibration detection sensor, and a waterproofing member disposed on the shielding member and covering the vibration detection sensor.

According to various embodiments of the disclosure, the electronic device may detect driving noise and vibration using a noise detection module including a microphone module and a vibration detection sensor capable of detecting vibration of a low frequency band (e.g., 0 Hz to 2100 Hz).

According to various embodiments of the disclosure, the electronic device may reduce noise based on signals obtained from the microphone module and the vibration detection sensor.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
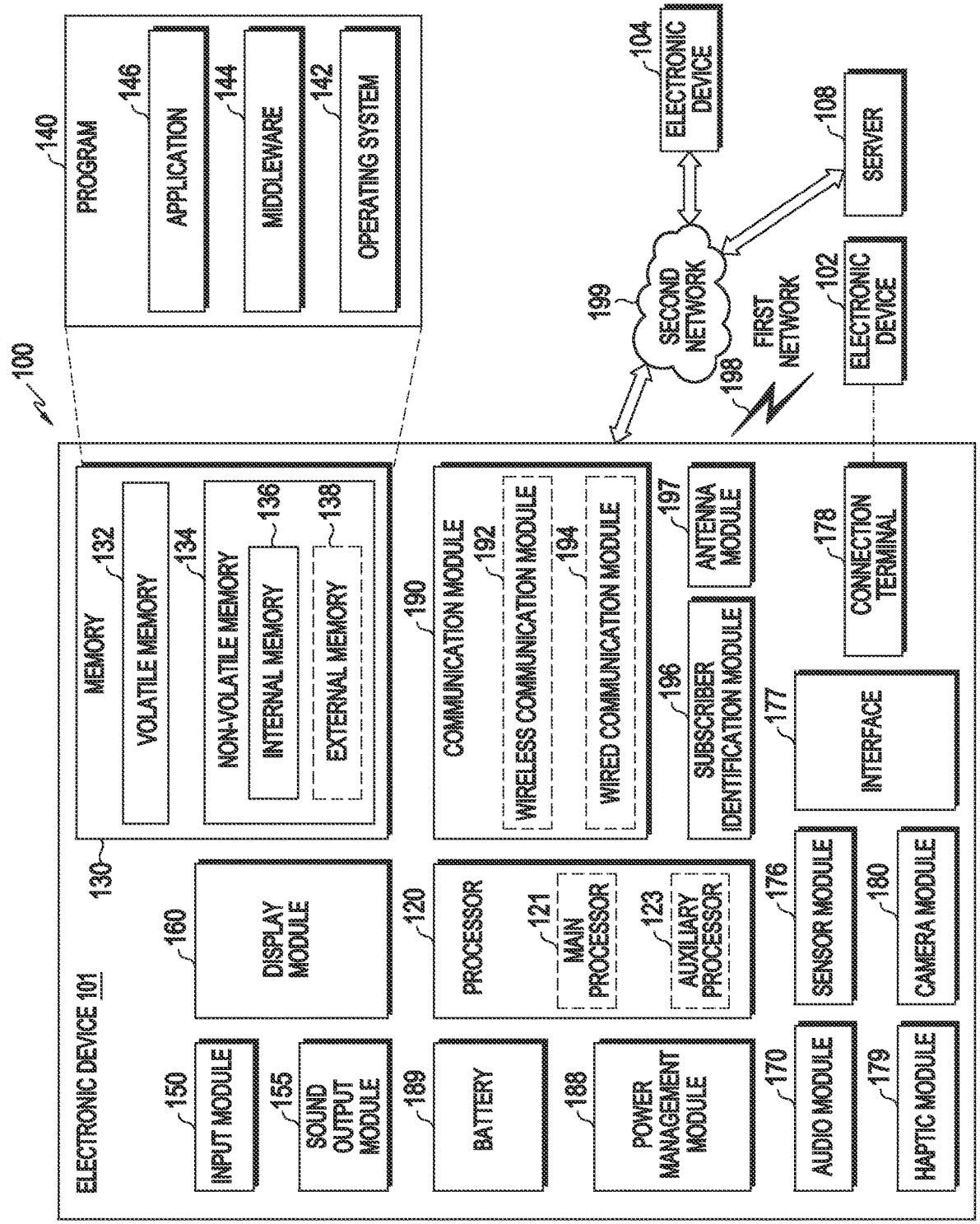
FIG. 1 is a block diagram illustrating an electronic device in a network environment according to an embodiment of the disclosure.

FIG. 1 is a block diagram illustrating an electronic device in a network environment according to an embodiment of the disclosure;

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
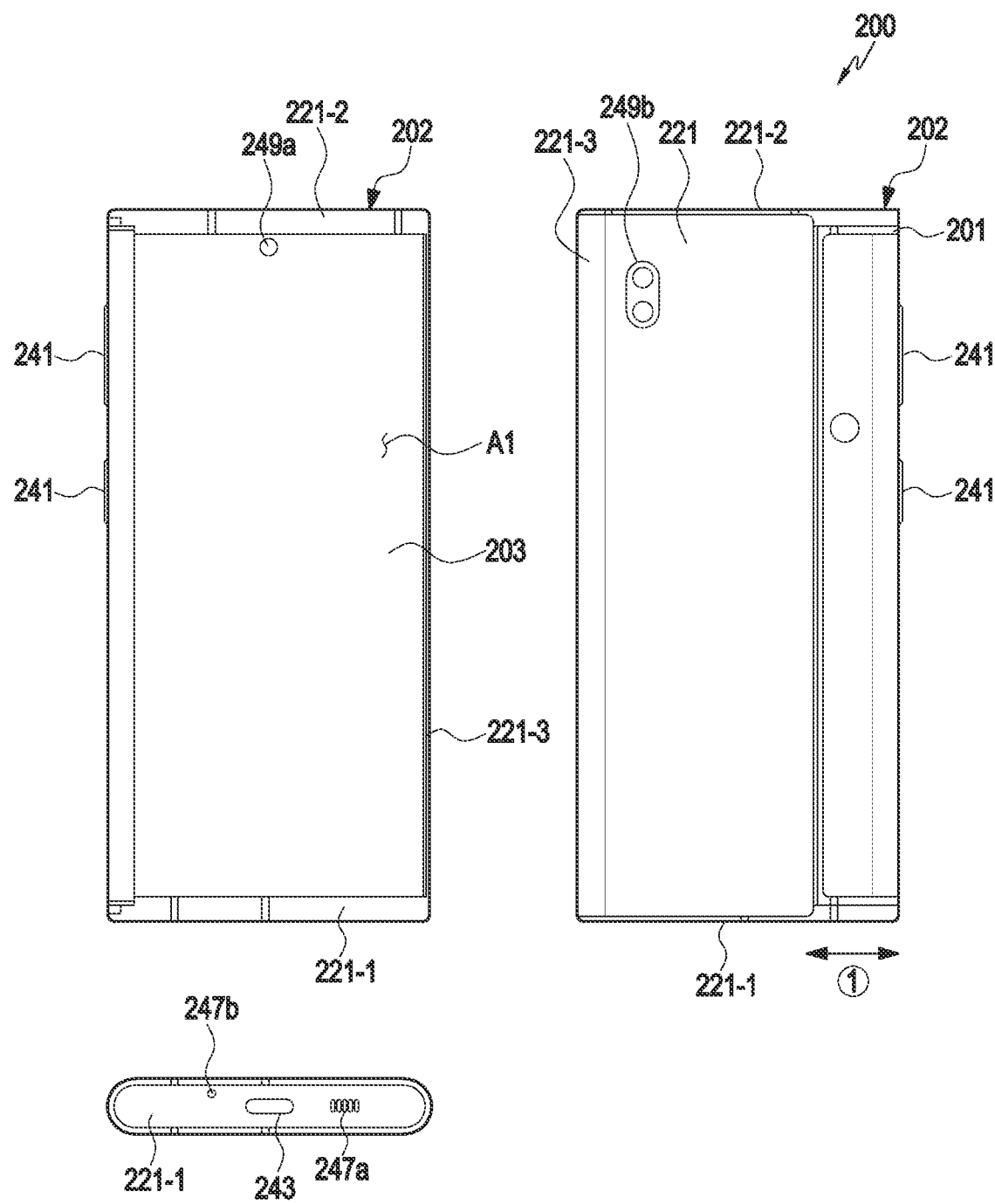
FIG. 2 is a view illustrating a state in which a second display area of a flexible display is received in a second housing, according to an embodiment of the disclosure.

FIG. 2 is a view illustrating a state in which a second display area of a flexible display is received in a second housing, according to an embodiment of the disclosure.

Figure 3:
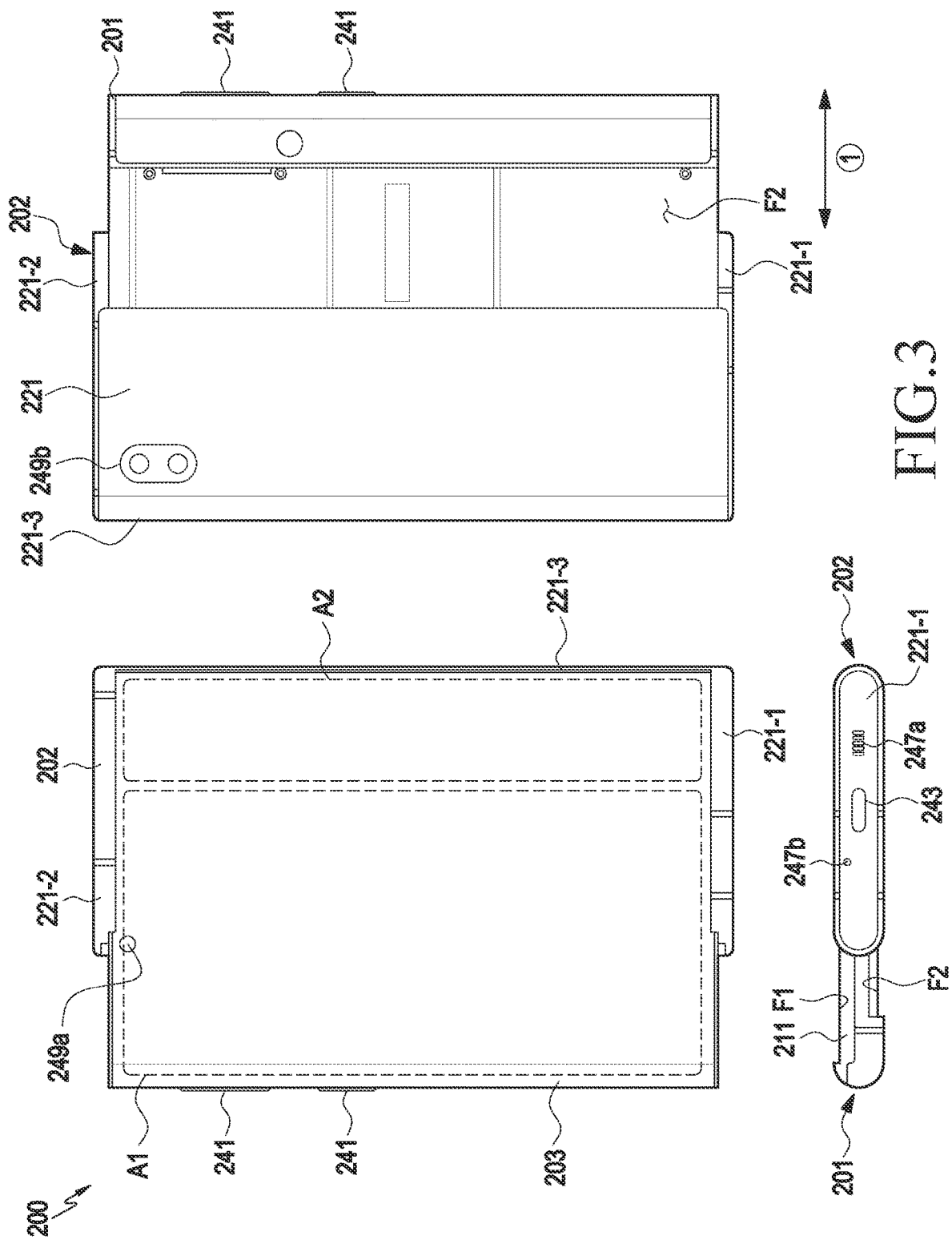
FIG. 3 is a view illustrating a state in which a second display area of a flexible display is exposed to the outside of a second housing, according to an embodiment of the disclosure.

FIG. 3 is a view illustrating a state in which a second display area of a flexible display is visually exposed to the outside of a second housing, according to an embodiment of the disclosure.

The state shown in FIG. 2 may be defined as a first housing 201 being closed with respect to a second housing 202, and the state shown in FIG. 2 may be defined as the first housing 201 being open with respect to the second housing 202. According to an embodiment, the "closed state" or "opened state" may be defined as a closed or open state of the electronic device.

Referring to FIGS. 2 and 3, an electronic device 200 may include housings 201 and 202. The housings 201 and 202 may include a second housing 202 and a first housing 201 movably disposed with respect to the second housing 202. According to an embodiment, the electronic device 200 may be interpreted as having a structure in which at least a portion of the second housing 202 is slidably disposed on the first housing 201. According to an embodiment, the first housing 201 may be disposed to perform reciprocating motion by a predetermined distance in the shown direction with respect to the second housing 202, for example, a direction indicated by the arrow ①.

According to an embodiment, the first housing 201 may be referred to as, for example, a first structure, a slide unit, or a slide housing, and may be disposed to reciprocate on the second housing 202. According to an embodiment, the second housing 202 may be referred to as, for example, a second structure, a main part, or a main housing, and may include various electric or electronic components such as a substrate or a battery. A portion (e.g., the first display area A1) of the display 203 may be disposed on the first housing 201. According to an embodiment, another portion (e.g., the second display area A2) of the display 203 may be received into the inside of the second housing 202 (e.g., a slide-in motion) or be visually exposed to the outside of the second housing 202 (e.g., a slide-out motion) as the first housing 201 moves (e.g., slides) with respect to the second housing 202. According to various embodiments, the first housing 201 may include a slide plate 211 (e.g., the first plate 211a and/or the second plate 211c of FIG. 4). The slide plate 211 may support at least a portion of the flexible display 203. The slide plate 211 may include a first surface (e.g., the first surface F1 of FIG. 4) and a second surface F2 facing away from the first surface F1.

Figure 4:
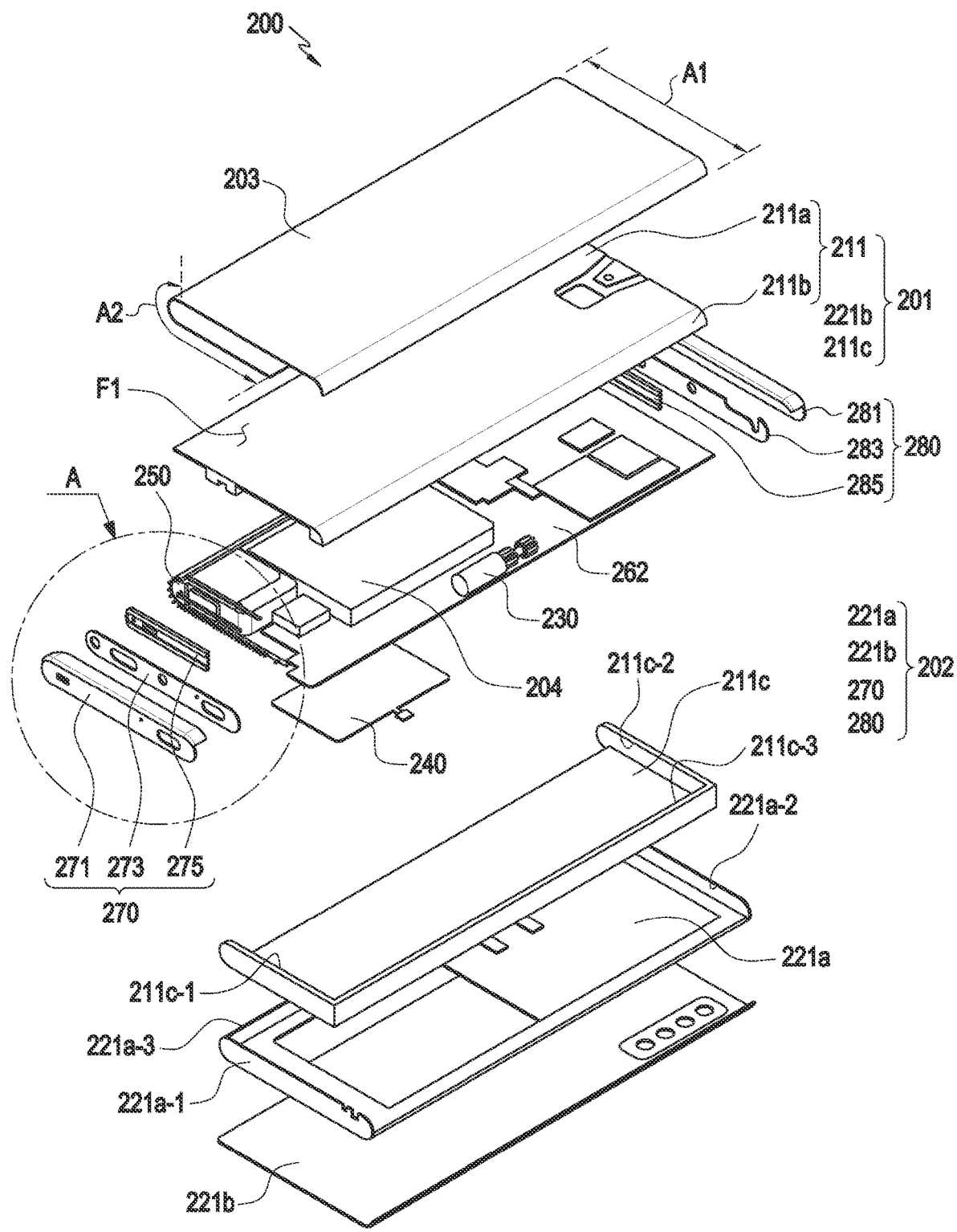
FIG. 4 is an exploded perspective view illustrating an electronic device according to an embodiment of the disclosure.

According to various embodiments, the second housing 202 may include a supporting member 221 (e.g., the third plate 221a and/or the fourth plate 221b of FIG. 4). The supporting member 221 may be formed to be open at one side (e.g., a front face) to receive (or surround) at least a portion of the slide plate 211. For example, at least a portion of the first housing 201 may be positioned in the second housing 202 while being surrounded by the second housing 202, and the first housing 201 may slide in the direction of the arrow ① while being guided by the second housing 202.

According to various embodiments, the supporting member 221 may include a first sidewall 221-1, a second sidewall 221-2 substantially parallel to the first sidewall 221-1, and a third sidewall 221-3 substantially perpendicular to the first sidewall 221-1 or the second sidewall 221-2. According to an embodiment, the first sidewall 221-1, the second sidewall 221-2, and the third sidewall 221-3 of the supporting member 221 surround at least a portion of the first housing 201. According to an embodiment, the first sidewall 221-1, the second sidewall 221-2, and the third sidewall 221-3 of the supporting member 221 may be integrally formed. According to another embodiment, the first sidewall 221-1, the second sidewall 221-2, and the third sidewall 221-3 of the supporting member 221 may be formed as separate components and combined or assembled.

According to various embodiments, the supporting member 221 may cover at least a portion of the flexible display 203. For example, at least a portion of the flexible display 203 may be received in the second housing 202. Further, the supporting member 221 may cover a portion of the flexible display 203 received in the second housing 202.

According to various embodiments, the first housing 201 may be moved in an open state and closed state with respect to the second housing 202 in a first direction (e.g., direction ①) substantially parallel to the first sidewall 221-1 or the second sidewall 221-2 of the supporting member 221. The first housing 201 may be moved to be positioned at a first distance from the third sidewall 221-3 in the closed state. In the open state, the first housing 201 may be moved to be positioned at a second distance greater than the first distance from the third sidewall 221-3. In some embodiments, in the closed state, the first housing 201 may face at least a portion of the third sidewall 221-3.

According to various embodiments, the electronic device 200 may include a display 203, a key input device 241, a connector hole 243, audio modules 247a and 247b, or camera modules 249a and 249b. Although not shown, the electronic device 200 may further include an indicator (e.g., a light emitting diode (LED) device) or various sensor modules. The configuration of the display 203, audio module 247a and 247b, and camera module 249 of FIGS. 2 and 3 may be identical in whole or part to the configuration of the display module 160, the audio module 170, and the camera module 180 of FIG. 1.

According to various embodiments, the display 203 may include a first display area A1 and a second display area A2. According to an embodiment, the first display area A1 may be visually exposed to the outside of the electronic device 200 in a closed state (e.g., FIG. 2) and an open state (e.g., FIG. 3) of the electronic device 200. According to an embodiment, at least a portion of the first display area A1 may be disposed on the first housing 201. For example, at least a portion of the first display area A1 may extend substantially across at least a portion of the first surface F1 to be disposed on the slide plate 211. According to an embodiment, the second display area A2 may be positioned inside the electronic device 200 in the closed state (e.g., FIG. 2) of the electronic device 200, and the second display area A2 may be visually exposed to the outside of the electronic device 200 in the open state (e.g., FIG. 3). For example, the second display area A2 may extend from the first display area A1 and, as the first housing 201 slides, be inserted or received into the second housing 202 (e.g., structure) or visually exposed to the outside of the second housing 202.

According to various embodiments, the second display area A2 may be substantially moved while being guided by a roller (e.g., the roller 250 of FIG. 4) mounted on the second housing 202 and may thus be received into the second housing 202 or visually exposed to the outside. According to an embodiment, the second display area A2 may move based on a slide of the first housing 201 in the first direction (e.g., the direction indicated by the arrow η). For example, while the first housing 201 slides, a portion of the second display area A2 may be deformed into a curved shape in a position corresponding to the roller 250.

According to various embodiments, when viewed from above the slide plate 211, if the first housing 201 moves from the closed state to the open state, the second display area A2 may be exposed to the outside of the second housing 202 to be substantially coplanar with the first display area A1. The display 203 may be disposed to be coupled with, or adjacent, a touch detecting circuit, a pressure sensor capable of measuring the strength (pressure) of touches, and/or a digitizer for detecting a magnetic field-type stylus pen. In one embodiment, the second display area A2 may be at least partially received inside the second housing 202, and a portion of the second display area A2 may be exposed to the outside even in the state shown in FIG. 1 (e.g., the closed state). According to an embodiment, irrespective of the closed state or the open state, the exposed portion of the second display area A2 may be positioned on the roller (e.g., the roller 250 of FIG. 4) and, in a position corresponding to the roller 250, a portion of the second display area A2 may be bent.

According to various embodiments, the key input device 241 may be disposed on the second housing 202. For example, the key input device 241 may be disposed on the third sidewall 221-3. As another example, the key input device 241 may be disposed on the second sidewall 221-2 or the first sidewall 221-1. Depending on the appearance and the state of use, the electronic device 200 may be designed to omit the illustrated key input device 241 or to include additional key input device(s). According to an embodiment, the electronic device 200 may include a key input device (not shown), e.g., a home key button or a touchpad disposed around the home key button. According to an embodiment, at least a portion of the key input device 241 may be positioned on an area of the first housing 201.

According to various embodiments, the connector hole 243 may be omitted or may receive a connector (e.g., a universal serial bus (USB) connector) for transmitting and receiving power and/or data with an external electronic device. Although not shown, the electronic device 200 may include a plurality of connector holes 243, and some of the plurality of connector holes 243 may function as connector holes for transmitting/receiving audio signals with an external electronic device. In the illustrated embodiment, the connector hole 243 is formed in the third sidewall 223c, but the present invention is not limited thereto. For example, the connector hole 243 or a connector hole not shown may be formed in the first sidewall 221-1 or the second sidewall 221-2.

According to various embodiments, the audio modules 247a and 247b may include at least one speaker hole 247a or at least one microphone hole 247b. The speaker hole 247a may be provided as a receiver hole for voice calls and/or an external speaker hole. The electronic device 200 may include a microphone for obtaining sound. The microphone may obtain external sound of the electronic device 200 through the microphone hole 247b. According to an embodiment, the electronic device 200 may include a plurality of microphones to detect the direction of sound. According to an embodiment, the speaker hole 247a and the microphone hole 247b may be implemented as one hole, or a speaker may be included without the speaker hole 247a (e.g., a piezo speaker). According to an embodiment, the speaker hole 247a or the microphone hole 247b may be formed in the second housing 202.

According to various embodiments, the camera module 249b may be positioned in the second housing 202 and may capture a subject in a direction opposite to the first display area A1 of the display 203. The electronic device 200 may include a plurality of camera modules. For example, the electronic device 200 may include at least one of a wide-angle camera, a telephoto camera, or a close-up camera. According to an embodiment, the electronic device 200 may measure the distance to the subject by including an infrared projector and/or an infrared receiver. The camera module 249 may include one or more lenses, an image sensor, and/or an image signal processor. The electronic device 200 may further include another camera module 249a that captures a subject in a direction opposite to the camera module 249b. For example, the other front camera may be disposed around the first display area A1 or in an area overlapping the display 203 and, when disposed in the area overlapping the display 203, may capture the subject using a hole formed in the display 203 or through the display 203.

According to various embodiments, an indicator (not shown) of the electronic device 200 may be disposed on the first housing 201 or the second housing 202, and the indicator may include a light emitting diode to provide state information about the electronic device 200 as a visual signal. The sensor module (not shown) of the electronic device 200 may produce an electrical signal or data value corresponding to the internal operation state or external environment state of the electronic device. The sensor module may include, for example, a proximity sensor, a fingerprint sensor, or a biometric sensor (e.g., an iris/face recognition sensor or a heartrate monitor (HRM) sensor).

According to an embodiment, the sensor module may further include, e.g., at least one of a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

FIG. 4 is an exploded perspective view illustrating an electronic device according to an embodiment of the disclosure.

Figure 5:
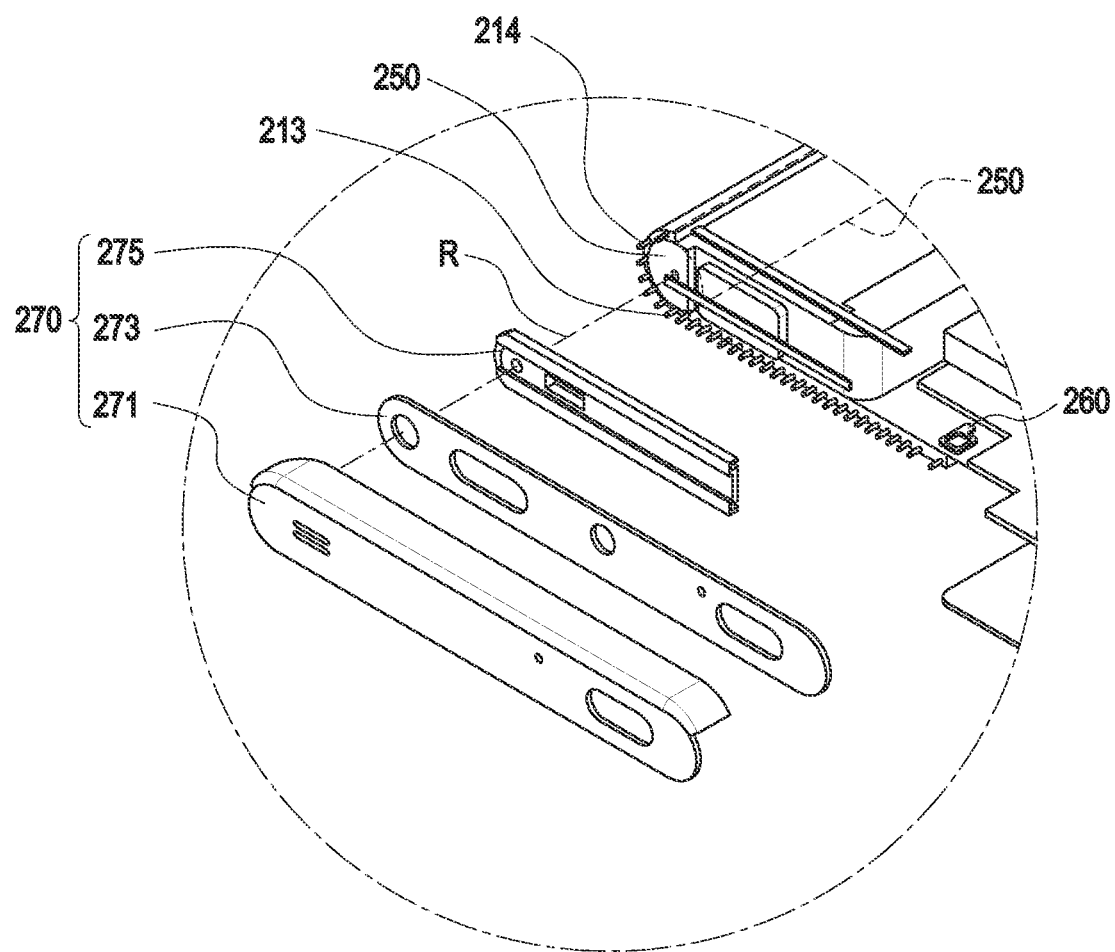
FIG. 5 is an enlarged view of area A of FIG. 4 according to an embodiment of the disclosure.

FIG. 5 is an enlarged view of area A of FIG. 4 according to an embodiment of the disclosure.

Referring to FIGS. 4 and 5, an electronic device 200 may include a first housing 201, a second housing 202 (e.g., a structure), a display 203 (e.g., a flexible display, a foldable display, or a rollable display), a roller 250, and/or an articulated hinge structure 213. A portion of the display 203 (e.g., the second display area A2) may be received in the first housing 201 or the second housing 202 while being guided by the roller 250. The configuration of the first housing 201, the second housing 202, and the display 203 of FIG. 4 may be identical in whole or part to the configuration of the first housing 201, the second housing 202, and the display 203 of FIGS. 2 and 3.

According to various embodiments, the slide plate 211 of the first housing 201 may include a first plate 211a and a first bracket 211b extending from the first plate 211a. The first housing 201, e.g., the first plate 211a and/or the first bracket 211b, may be formed of a metallic material and/or a non-metallic material (e.g., polymer). The first plate 211a may be connected to the second housing 202 and may linearly reciprocate in one direction (e.g., the direction of arrow ① in FIG. 1) while being guided by the second housing 202. According to an embodiment, the first plate 211a may include a first surface F1. The first display area A1 of the display 203 may be substantially disposed on the first surface F1 to maintain a flat panel shape. In one embodiment, the first bracket 211b may be coupled to the first plate 211a and, along with the first plate 211a, may support a part of the display 203 (e.g., an end of the first display area A1). According to an embodiment, the first plate 211a and the first bracket 211b may be integrally formed. For example, the first plate 211a and the first bracket 211b may be manufactured as one component.

According to various embodiments, the slide plate 211 of the first housing 201 may include a second plate 211c. According to an embodiment, the second plate 211c, as an auxiliary slide cover or a front case, may form at least a portion of an internal space of the first housing 201. According to an embodiment, a portion of the second plate 211c may be open, and it may be formed to surround a component (e.g., the main circuit board 262) of the electronic device 200. For example, the second plate 211c may include a 2-1th sidewall 211c-1, a 2-2th sidewall 211c-2 substantially parallel to the 2-1th sidewall 211c-1, and a 2-3th sidewall 211c-3 substantially perpendicular to the 2-1th sidewall 211c-1 and the 2-2th sidewall 211c-2.

According to various embodiments, the articulated hinge structure 213 may be connected to the display 203 and/or the first housing 201. For example, as the first housing 201 slides relative to the second housing 202, the articulated hinge structure 213, along with the first housing 201, may slide with respect to the second housing 202. At least a portion of the articulated hinge structure 213 may be substantially received inside the housings 201 and 202 (e.g., the first housing 201 and/or the second housing 202) in the closed state (e.g., FIG. 2). According to an embodiment, a portion of the articulated hinge structure 213 may be positioned to correspond to the roller 250 between the inner surface of the second housing 202 and the outer surface of the first housing 201.

According to various embodiments, the articulated hinge structure 213 may include a plurality of bars or rods 214. The plurality of rods 214 may extend in a straight line and be disposed parallel to the rotational axis R of the roller 250, and the plurality of rods 214 may be arranged along a direction perpendicular to the rotational axis R (e.g., the direction along which the first housing 201 slides).

According to various embodiments, each rod 214, along with its adjacent rod 214, may slide while remaining substantially parallel to the adjacent rod 214. According to an embodiment, as the first housing 201 slides, the plurality of rods 214 may be arranged to form a curved shape or may be arranged to form a planar shape. For example, as the first housing 201 slides, a portion of the articulated hinge structure 213 facing the roller 250 may form a curved surface, and another portion of the articulated hinge structure 213 may form a plane. According to an embodiment, at least a portion of the second display area A2 of the display 203 may be disposed or supported on the articulated hinge structure 213 and, in the open state (e.g., FIG. 3), at least a portion of the second display area A2, along with the first display area A1, may be visually exposed to the outside of the second housing 202. In the state in which the second display area A2 is exposed to the outside of the second housing 202, the articulated hinge structure 213 may substantially form a flat surface, thereby supporting or maintaining the second display area A2 in the flat state. According to an embodiment, the articulated hinge structure 213 may be replaced with a bendable integral supporting member (not shown). According to an embodiment (not shown), the roller 250 may be omitted, and the articulated hinge structure 215 may slide along the 3-3th sidewall 221a-3 of the third plate 221a. The inner surface of the 3-3th sidewall 221a-3 is formed as a curved surface to guide the articulated hinge structure 215.

According to various embodiments, the second housing (e.g., structure) may include at least one of a third plate 221a (e.g., a rear case or a main slide cover) or a fourth plate 221b (e.g., a rear window or a rear plate).

According to various embodiments, the third plate 221a may substantially form at least a portion of the exterior of the second housing 202 or the electronic device 200. According to an embodiment, the third plate 221a may include a 3-1th sidewall 221a-1 and a 3-2th sidewall 221a-2 formed substantially parallel to the 3-1th sidewall 221a-1. According to an embodiment, the configuration of the 3-1th sidewall 221a-1, the 3-2th sidewall 221a-2, and the 3-3th sidewall 221a-3 may be identical in whole or part to the configuration of the first sidewall 221-1, the second sidewall 221-2, and the third sidewall 221-3 of FIGS. 2 and 3.

According to various embodiments, the fourth plate 221b may be coupled to the outer surface of the third plate 221a. According to an embodiment, the fourth plate 221b may be integrally formed with the third plate 221a. According to an embodiment, the fourth plate 221b may provide a decorative effect on the exterior of the electronic device 200. For example, the third plate 221a may be formed of at least one of a metal or a polymer, and the fourth plate 221b may be formed of at least one of metal, glass, synthetic resin, or ceramic. According to an embodiment, the third plate 221a and/or the fourth plate 221b may be formed of a material that transmits light at least partially (e.g., an auxiliary display area). For example, in a state in which a portion of the display 203 (e.g., the second display area A2) is received in the housings 201 and 202, the electronic device 200 may output visual information using a partial area of the display 203 received in the housings 201 and 202. The auxiliary display area may be a portion of the second housing 202 in which the display 203 received in the second housing 202 is positioned.

According to various embodiments, the electronic device 200 may include a motor module (e.g., motor) 230. According to an embodiment, the motor module 230 may generate a rotational force by the power received from the battery 204 (e.g., the battery 189 of FIG. 1). According to an embodiment, the motor module 230 may be connected to the articulated hinge structure 213 or the first housing 201, and the motor module 230 may transfer the generated rotational force to the articulated hinge structure 213 or the first housing 201.

According to various embodiments, the electronic device 200 may include an antenna module 240. According to an embodiment, the antenna module 240 may include at least one of an antenna for wireless charging, an antenna for near field communication (NFC), or an antenna for magnetic secure transmission (MST). According to an embodiment, the antenna module 240 may be disposed in the inner space of the second housing 202. The configuration of the antenna module 240 of FIG. 4 may be identical in whole or part to the configuration of the antenna module 197 of FIG. 1.

According to various embodiments, the electronic device 200 may include a noise detection module (e.g., noise detection circuitry) 260. According to an embodiment, the electronic device 200 may include a main circuit board 262. The noise detection module 260 may be mounted on the main circuit board 262. For example, the noise detection module 260 may be positioned in the housings 201 and 202 in which the main circuit board 262 is positioned. According to an embodiment, the noise detection module 260 may be connected to the substrate (e.g., main circuit board 262) and provided as one module, and the noise detection module 260 may be disposed within the first housing 201 and/or the second housing 202. The noise detection module 260 is described below in greater detail in connection with FIG. 8.

According to various embodiments, the electronic device 200 may include a first side housing 270 and/or a second side housing 280. The first side housing 270 may be positioned on a side surface of the electronic device 200. According to an embodiment, the first side housing 270 may include a first side cap portion 271 surrounding a portion (e.g., the side surface) of the electronic device 200, a first slide rail 275 capable of guiding the movement of the articulated hinge structure 213, and a first side bracket 273 connecting the first side cap portion 271 and the first slide rail 275. According to an embodiment, the second side housing 280 may include a second side cap portion 281 surrounding a portion (e.g., the side surface) of the electronic device 200, a second slide rail 285 capable of guiding the movement of the articulated hinge structure 213, and a second side bracket 283 connecting the second side cap portion 281 and the second slide rail 285. According to an embodiment, the second side housing 280 may be positioned opposite to the first side housing 270 with respect to the third plate 221a. According to an embodiment, the first side housing 270 and the second side housing 280 may be wholly or partially identical in configuration to the first sidewall 221-1 and the second sidewall 221-2, respectively.

Figure 6:
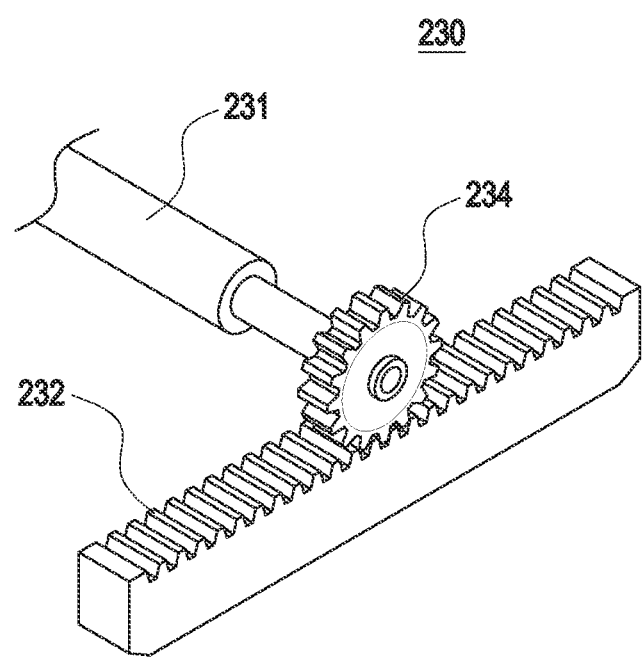
FIG. 6 is a view schematically illustrating a motor module according to an embodiment of the disclosure.

FIG. 6 is a view schematically illustrating a motor module according to an embodiment of the disclosure.

Referring to FIG. 6, a motor module 230 may include a motor core 231 for generating driving force, a motor rail 232 connected with a housing of an electronic device 200 (e.g., a first housing 201 or a second housing 202 of FIG. 2) or an articulated hinge structure (e.g., an articulated hinge structure 213 of FIG. 4), and/or at least one gear 233 and 234 for transferring a driving force generated in a motor core 231 to another component. The configuration of the motor module 230 of FIG. 6 may be identical in whole or part to the configuration of the motor module 230 of FIG. 4.

According to various embodiments, the motor module 230 may slide the first housing (e.g., the first housing 201 of FIG. 4). For example, the motor module 230 may include at least one of a motor core 231 (e.g., a servo motor or a step motor) for converting electric power into rotational force to generate a driving force for sliding the first housing 201, a motor rail 232 (e.g., a rack gear), and at least one gear 234 (e.g., a pinion) connected with the motor core 231 and configured to rotate relative to the motor rail 232.

According to various embodiments, the motor module 230 may be connected with the first housing (e.g., the first housing 201 of FIG. 4). For example, the motor rail 232 may be disposed on a slide plate (e.g., the first plate 211a or the second plate 211c of FIG. 4) of the first housing 201, and the motor core 231 may be positioned in the second housing 202. According to an embodiment, as the gear 234 connected to the motor core 231 rotates, the first housing 201 may slide with respect to the second housing 202.

According to various embodiments, the motor module 230 may be connected with an articulated hinge structure (e.g., the articulated hinge structure 213 of FIG. 4). For example, the gear 234 may be connected with articulated hinge structure 213 and, as the gear 234 rotates, the first housing 201 may slide with respect to the second housing 202.

Figure 7A:
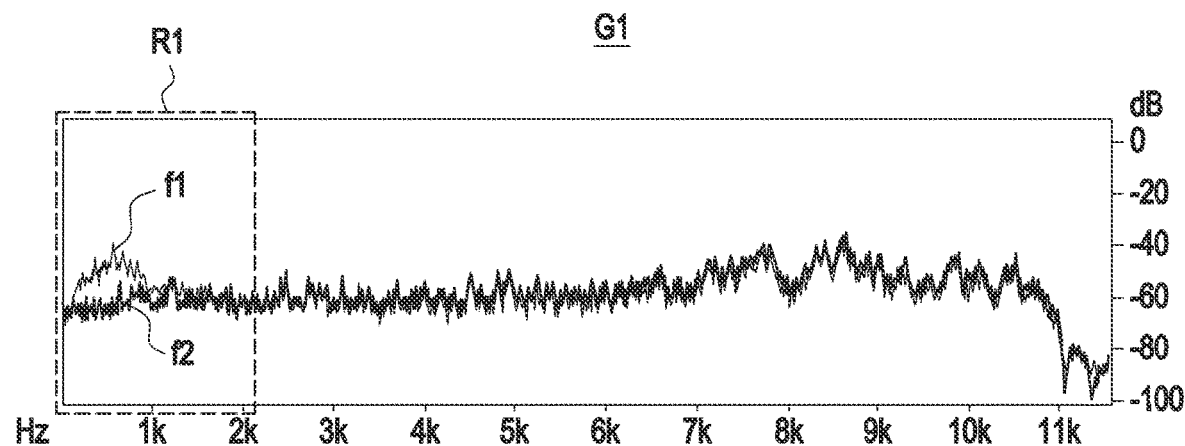
FIG. 7A is a graph illustrating noise detected by a microphone module according to an embodiment of the disclosure.
Figure 7B:
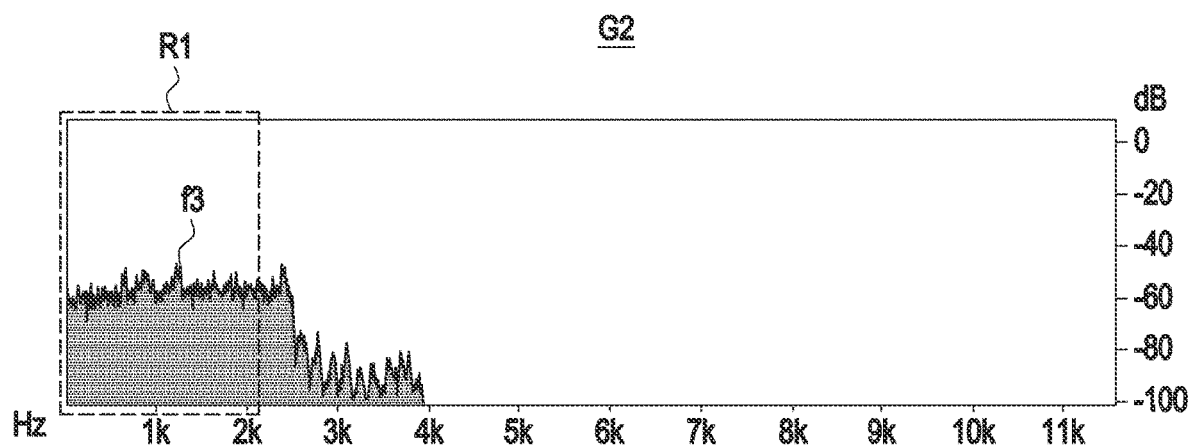
FIG. 7B is a graph illustrating noise detected by a vibration detection sensor according to an embodiment of the disclosure.

FIG. 7A is a graph G1 illustrating noise detected using a microphone module according to an embodiment of the disclosure, and FIG. 7B is a graph G2 illustrating noise detected using a vibration detection sensor, according to an embodiment of the disclosure.

Referring to FIG. 7A, a waveform of a frequency measured by a microphone (e.g., a microphone module 320 of FIG. 8) may be changed based on a mounting condition of an electronic device (e.g., an electronic device 200 of FIG. 2). For example, a first frequency waveform f1 is a graph representing the magnitude (e.g., decibel (dB)) of sound for frequency Hz when the electronic device 200 is driven with the electronic device 200 in the user's hand, and a second frequency waveform f2 is a graph representing the magnitude (e.g., decibel (dB)) of sound for frequency Hz when the electronic device 200 is driven, with the electronic device 200 mounted on a cradle. According to an embodiment, in a first frequency band (e.g., a low frequency band, 0 Hz to 2100 Hz) (R1), the difference in frequency according to the mounting environment is greater than in a high frequency band (e.g., 2100 Hz to 10000 Hz), so that if noise is detected using the microphone module 320 alone, the accuracy of noise detection may be reduced.

Referring to FIG. 7B, a vibration detection sensor (e.g., a vibration detection sensor 330 of FIG. 8) may detect vibration in a first frequency band R1. For example, a third frequency waveform f3 is a graph representing the magnitude of vibration generated through a medium (e.g., the second housing 202), other than air, from a component (e.g., the motor module 230) of the electronic device 200.

According to various embodiments, the electronic device 200 may use the microphone module 320 and the vibration detection sensor 330 together, increasing the accuracy of noise detection in the first frequency band R1.

Figure 8:
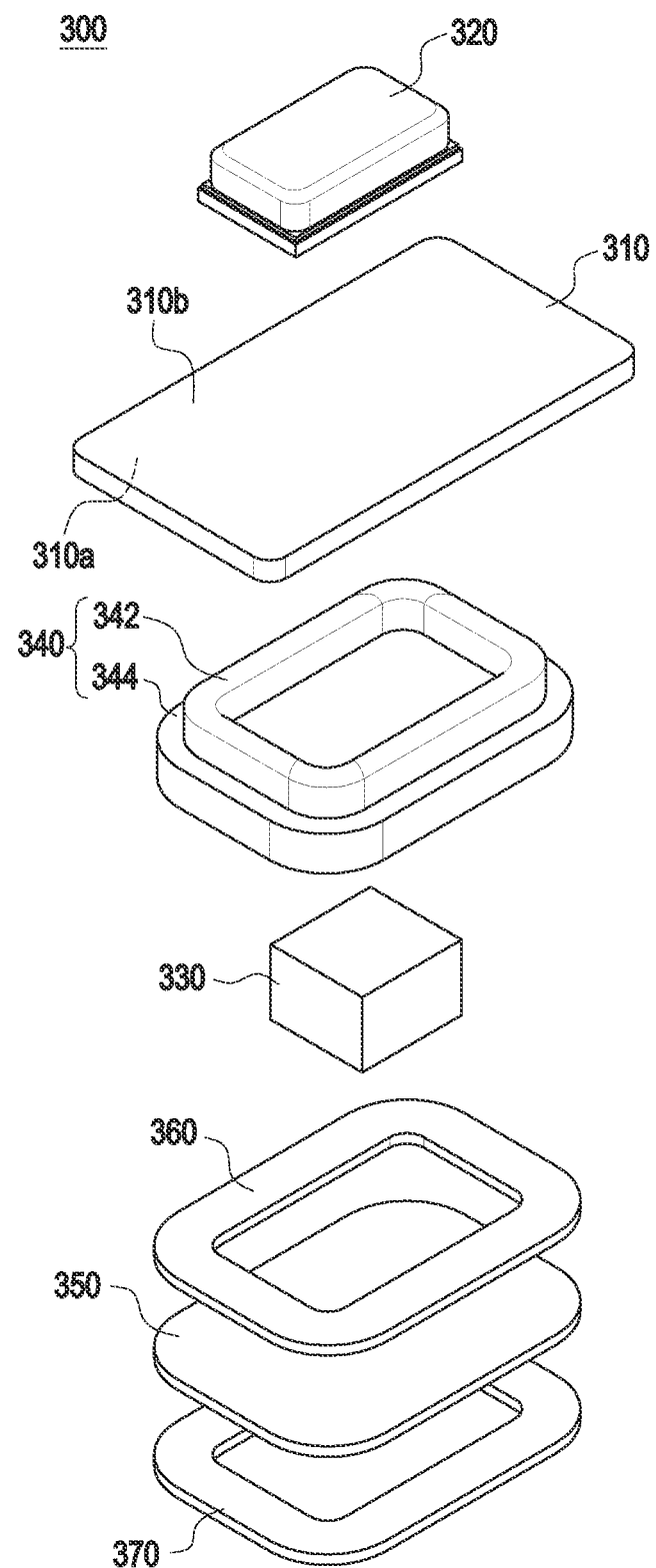
FIG. 8 is an exploded perspective view illustrating a noise detection module according to an embodiment of the disclosure.

FIG. 8 is an exploded perspective view illustrating a noise detection module according to an embodiment of the disclosure.

Figure 9:
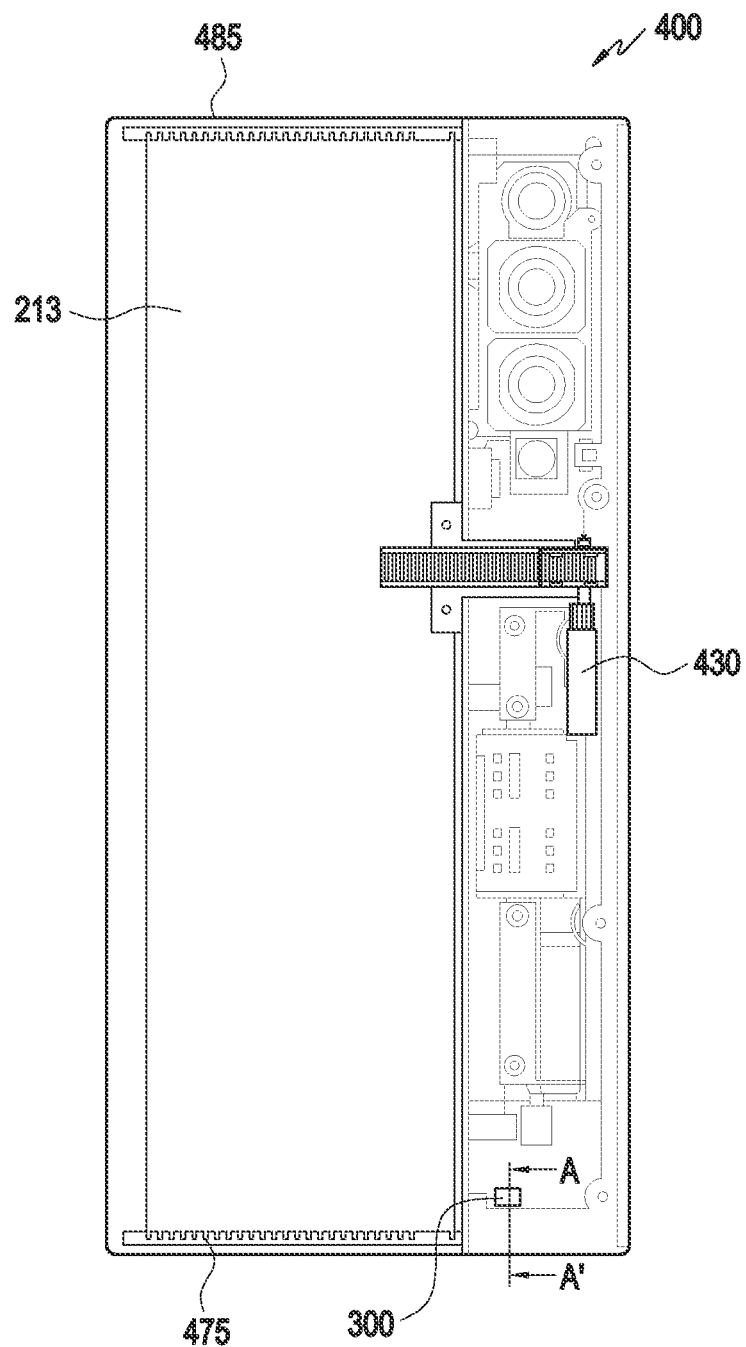
FIG. 9 is a front view illustrating an electronic device according to an embodiment of the disclosure.

FIG. 9 is a front view illustrating an electronic device according to an embodiment of the disclosure.

Figure 10:
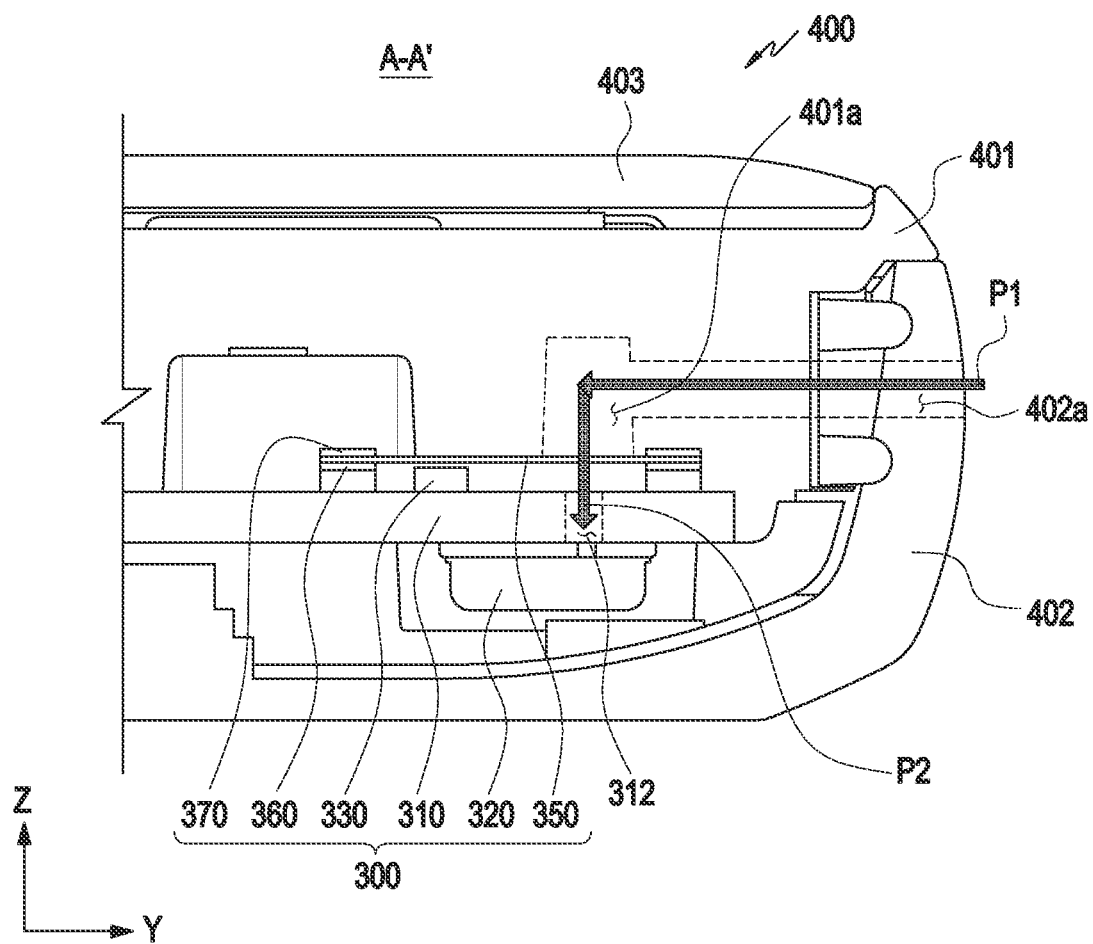
FIG. 10 is a cross-sectional view taken along line A-A' of FIG. 9 according to an embodiment of the disclosure.

FIG. 10 is a cross-sectional view taken along line A-A' of FIG. 9 according to an embodiment of the disclosure.

Figure 11:
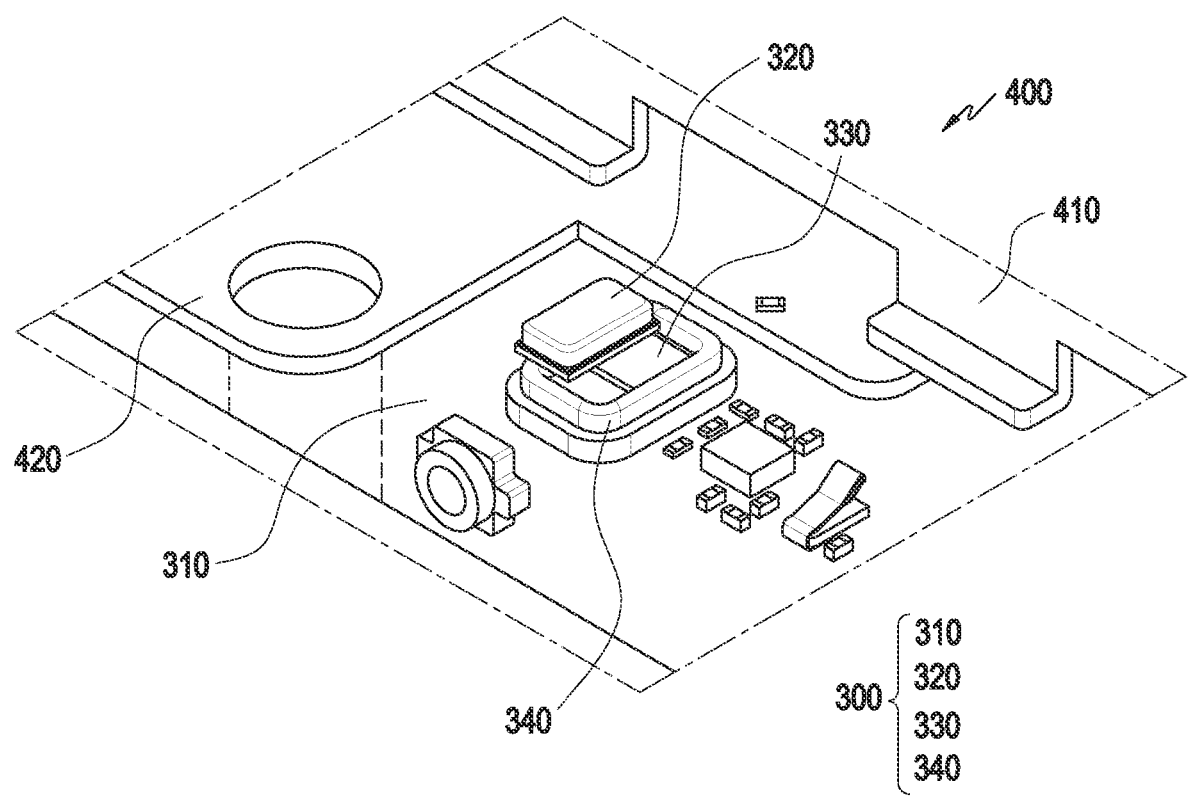
FIG. 11 is a perspective view illustrating a noise detection module mounted in an electronic device according to an embodiment of the disclosure.

FIG. 11 is a perspective view illustrating a noise reduction module mounted in an electronic device according to an embodiment of the disclosure.

Referring to FIGS. 8 to 11, an electronic device 400 may include a noise detection module 300. According to an embodiment, the noise detection module 300 may include a substrate 310, a microphone module (e.g., microphone circuitry) 320, a vibration detection sensor 330, a shielding member 340, and/or a waterproofing member 350. The configuration of the noise detection module 300 of FIGS. 8 to 11 may be identical in whole or part to the configuration of the noise detection module 260 of FIG. 5. The configuration of the electronic device 400, the first housing 401, the second housing 402, and the display 403 of FIGS. 9 and 10 may be identical in whole or part to the configuration of the electronic device 200, the first housing 201, the second housing 202, and the display 203 of FIGS. 2 to 4.

According to various embodiments, the noise detection module 300 may detect noise generated when the electronic device 400 is driven. For example, the noise detection module 300 may detect at least one of mechanical noise due to friction generated when the first housing 401 of the electronic device 400 moves with respect to the second housing 402 or electromagnetic noise generated from the coil of the motor module 430.

According to various embodiments, the noise detection module 300 may be positioned in at least one of the first housing 401 or the second housing 402. According to an embodiment, the substrate 310 of the noise detection module 300 may be coupled with the first housing 401 using the bracket 410 (e.g., the first plate 211*a* or the second plate 211*c* of FIG. 4). According to an embodiment, the substrate 310 of the noise detection module 300 may be coupled with the second housing 402 using a boss structure 420. The boss structure 420 may be a structure in which components of the electronic device 400 may be coupled or mounted using a screw or a coupling pin.

According to various embodiments, a microphone module 320 and/or a vibration detection sensor 330 may be disposed on the substrate 310. According to an embodiment, the microphone module 320 and the vibration detection sensor 330 may be electrically connected with a processor (e.g., the processor 120 of FIG. 1) or a battery (e.g., the battery 189 of FIG. 1) through the substrate 310. According to an embodiment, the substrate 310 may be a main circuit board (e.g., the main circuit board 262 of FIG. 4) of the electronic device 400. According to an embodiment, the substrate 310 may include a first substrate surface 310*a* and a second substrate surface 310*b* facing in a direction opposite to the first substrate surface 310*a*.

According to various embodiments, the substrate 310 may include a microphone hole 312 connected to the microphone module 320. According to an embodiment, the microphone module 320 may obtain an external sound of the electronic device 400 through the microphone hole 312. For example, the microphone hole 312 may be connected to at least one of the first inner hole 401*a* of the first housing 401 and the second inner hole 402*a* of the second housing 402, forming a sound path P1 or P2 for transferring external sound or vibration of the electronic device 400 to the microphone module 320. According to an embodiment, the inner hole 401*a* may be a hole for forming a path of external sound of the electronic device 400 and may be wholly or partially identical in configuration to the audio modules 247*a* and 247*b* of FIGS. 2 and 3.

According to various embodiments, the microphone module 320 may receive at least one of driving noise and vibration of the electronic device 400, the user's voice, or noise of the surrounding environment. For example, the microphone module 320 may sense vibration transferred through an air medium and/or vibration transferred through a solid medium (e.g., the second housing 402). According to an embodiment, the microphone module 320 may be disposed on the substrate 310. For example, the microphone module 320 may be disposed on the first substrate surface 310*a* or the second substrate surface 310*b* of the substrate 310. According to an embodiment, the electronic device 400 may include an external microphone hole (e.g., the microphone hole 247*b* of FIG. 2) for providing the sound path P1 or P2 outside of the electronic device 400. The microphone module 320 may receive sound through the external microphone hole.

According to various embodiments, the vibration detection sensor 330 may detect a driving vibration of the electronic device 400. For example, the vibration detection sensor 330 may detect vibration transferred through a solid medium (e.g., the second housing 402) of the electronic device 400. According to an embodiment, the vibration detection sensor 330 may be a micro electron mechanical system (MEMS) sensor. For example, the vibration detection sensor 330 may include at least one fixed electrode (not shown) and at least one movable electrode (not shown). The vibration detection sensor 330 may measure acceleration based on the capacitance of the electrode generated when the positional relationship between the fixed electrode and the movable electrode is changed by an external force or driving of the electronic device 400 (e.g., movement of the first housing 401). According to an embodiment, the vibration detection sensor 330 may be a piezoelectric sensor or a piezoelectric resistance-type acceleration sensor. According to an embodiment, the vibration detection sensor 330 may be disposed on the substrate 310.

According to various embodiments, the shielding member 340 may reduce irregular vibration transferred to the noise detection module 300. According to an embodiment, the shielding member 340 may be formed of a material having elasticity and may absorb at least a portion of the vibration transferred to the microphone module 320 and/or the vibration detection sensor 330. For example, the shielding member 340 may include rubber.

According to various embodiments, the shielding member 340 may surround at least a portion of the vibration detection sensor 330. For example, the shielding member 340 may include a supporting area 344 surrounding the vibration detection sensor 330 and a protruding area 342 protruding from the supporting area 344 toward the substrate 310. According to an embodiment, at least one of the protruding area 342 or the supporting area 344 of the shielding member 340 may be formed in a closed curve shape. According to an embodiment, the shielding member 340 may be disposed on the substrate 310. For example, the shielding member 340 may be disposed between the substrate 310 and the first housing 401, and the protruding area 342 and the supporting area 344 may be compressed and contact the first substrate surface 310*a* of the substrate 310.

According to various embodiments, the waterproofing member 350 may reduce the inflow of moisture or dust into the noise detection module 300. For example, the waterproofing member 350 may cover the shielding member 340. The vibration detection sensor 330 may be positioned between the shielding member 340 and the waterproofing member 350. According to an embodiment, the waterproofing member 350 may be coupled to the supporting area 344 of the shielding member 340 using a first adhesive member 360.

According to various embodiments, the noise detection module 300 may include at least one of the first adhesive member 360 or a second adhesive member 370. According to an embodiment, the first adhesive member 360 may be positioned between the shielding member 340 and the waterproofing member 350 and may couple the shielding member 340 with the waterproofing member 350. According to an embodiment, the second adhesive member 370 may be positioned in a direction opposite to the first adhesive member 360 with respect to the waterproofing member 350 and may form at least a portion of the outer surface of the noise detection module 300. The noise detection module 300 may be coupled to the housing (e.g., the first housing 401) through the second adhesive member 370.

According to various embodiments, the first adhesive member 360 and/or the second adhesive member 370 may absorb at least a portion of vibration. For example, the first adhesive member 360 and the second adhesive member 370 may absorb at least a portion of the sound transferred to the microphone module 320 or at least a portion of residual vibration or irregular vibration transferred to the vibration detection sensor 330. According to an embodiment, the first adhesive member 360 and the second adhesive member 370 may include an anti-vibration material (e.g., a damping sheet) for absorbing at least a portion of vibration.

Figure 12:
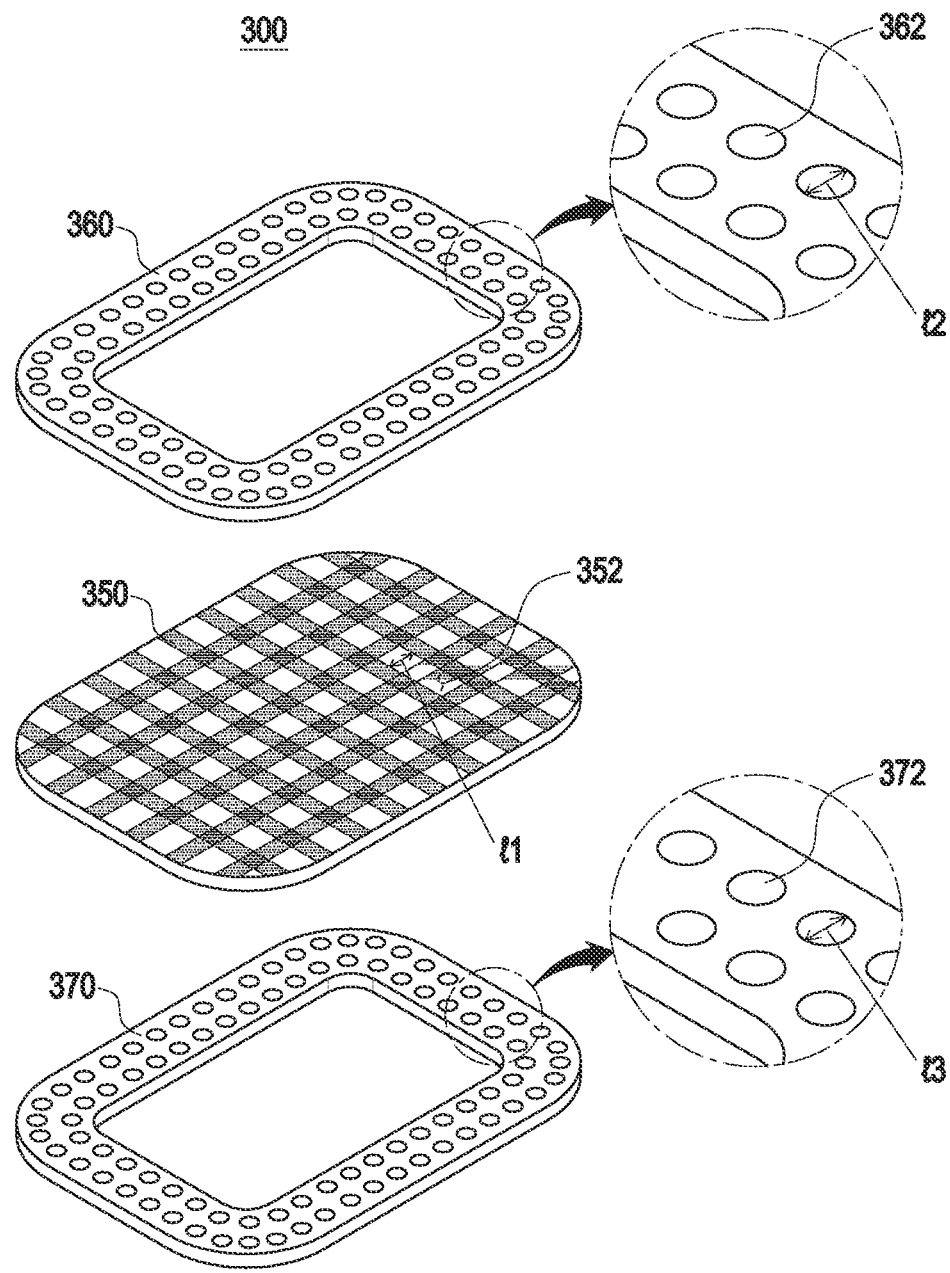
FIG. 12 is an exploded perspective view illustrating the waterproofing member, the first adhesive member, and the second adhesive member of FIG. 8 according to an embodiment of the disclosure.

FIG. 12 is an exploded perspective view illustrating a waterproofing member, a first adhesive member, and a second adhesive member of FIG. 8 according to an embodiment of the disclosure.

Referring to FIG. 12, at least one of a waterproofing member 350, a first adhesive member 360, and a second adhesive member 370 may include a through opening. The configuration of the noise detection module 300, the waterproofing member 350, the first adhesive member 360, and the second adhesive member 370 of FIG. 12 may be identical in whole or part to the configuration of the noise detection module 300, the waterproofing member 350, the first adhesive member 360, and the second adhesive member 370 of FIG. 8.

According to various embodiments, the waterproofing member 350 may be a mesh-shaped tape. For example, the waterproofing member 350 may include waterproofing member openings 352 with a first length l1. For example, the waterproofing member opening 352 may be formed to have a width or a diameter of the first length l1. The waterproofing member opening 352 may be formed in various shapes. For example, although FIG. 12 illustrates a waterproofing member 350 including rectangular waterproofing member openings 352, the waterproofing member openings 352 may be formed in a circular or slit shape. According to an embodiment, the waterproofing member 350 may include a fluorinated carbon resin (e.g., Gore-Tex). For example, the waterproofing member 350 may be formed of polytetrafluoroethylene (PTFE).

According to various embodiments, the first adhesive member 360 may include at least one first opening 362 having a second length l2. For example, the first opening 362 may be formed to have a width or a diameter of the second length l2. According to an embodiment, the resonant frequency of the first adhesive member 360 may be changed based on at least one of the number and shape of the first openings 362. According to an embodiment, the size of the first opening 362 may be greater than the size of the waterproofing member opening 352 of the waterproofing member 350. For example, the second length l2 may be greater than the first length l1.

According to various embodiments, the second adhesive member 370 may include at least one second opening 372 having a third length l3. For example, the second opening 372 may be formed to have a width or a diameter of the third length l3. According to an embodiment, the resonant frequency of the second adhesive member 370 may be changed based on at least one of the number and shape of the second openings 372. According to an embodiment, the size of the second opening 372 may be greater than the size of the waterproofing member opening 352 of the waterproofing member 350. For example, the third length l3 may be greater than the first length l1.

Figure 13:
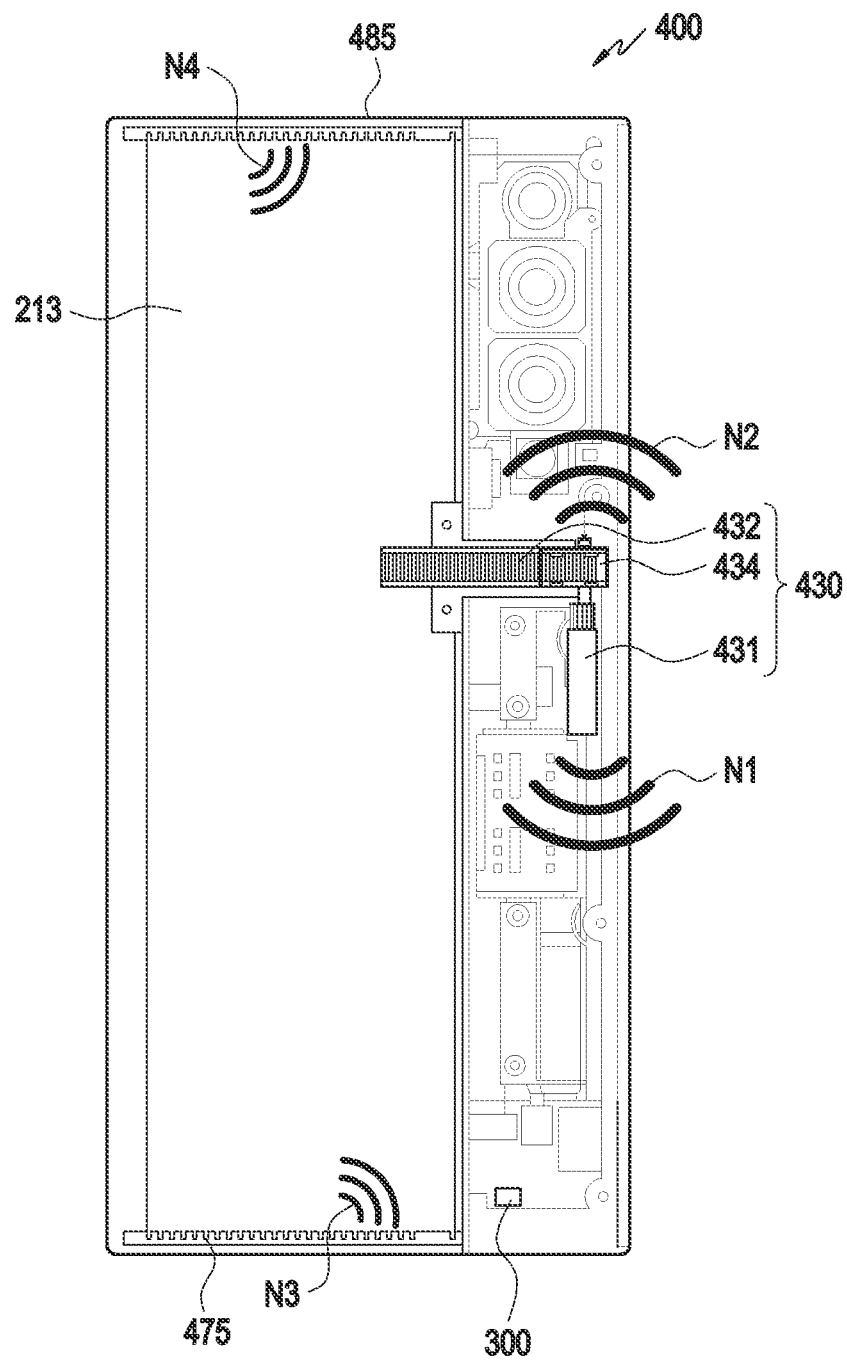
FIG. 13 is a view schematically illustrating an electronic device reducing noise according to an embodiment of the disclosure.

FIG. 13 is a view schematically illustrating an electronic device reducing noise according to an embodiment of the disclosure.

Figure 14:
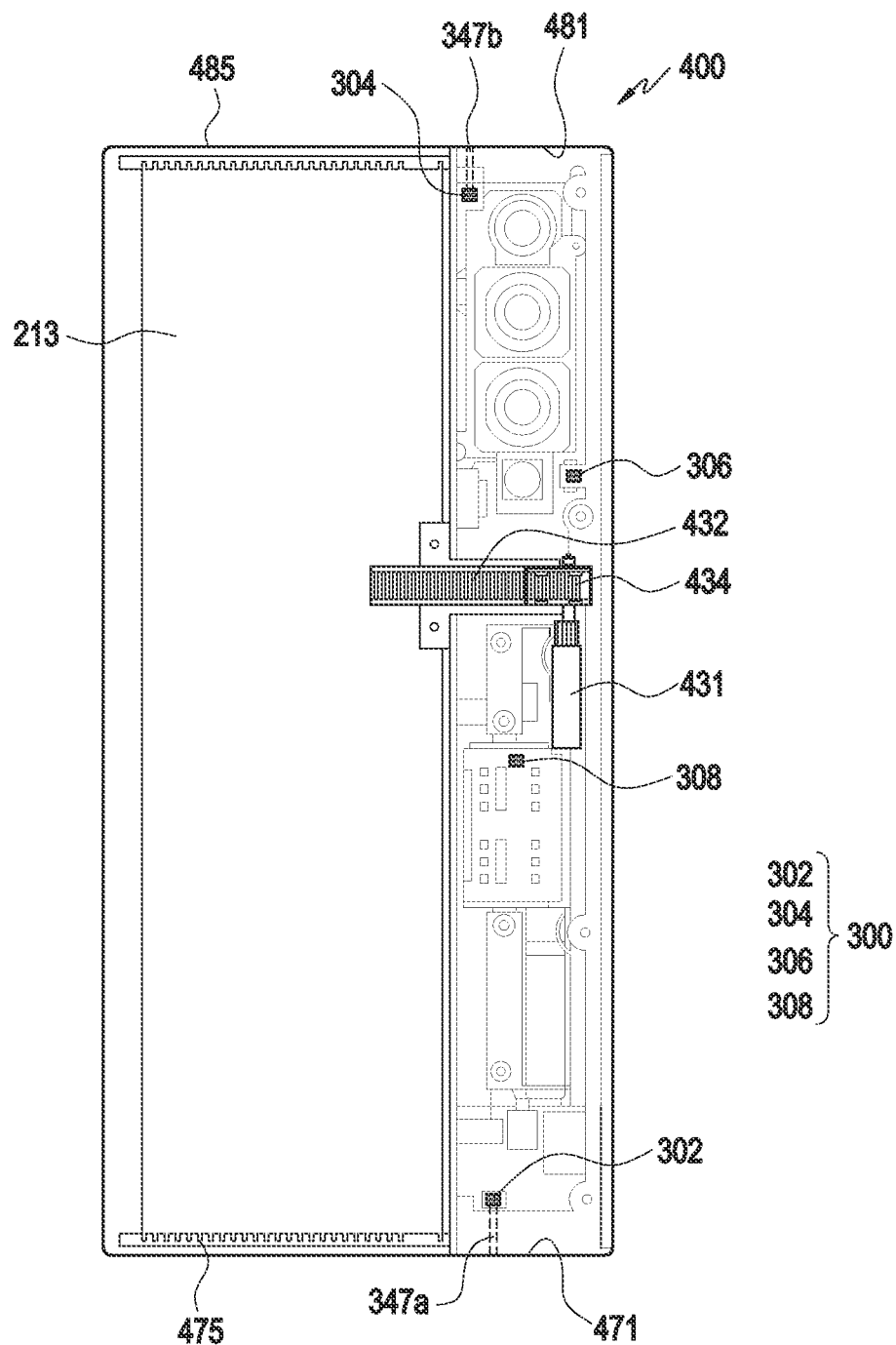
FIG. 14 is a view illustrating positions and number of noise reduction modules disposed in an electronic device according to an embodiment of the disclosure.

FIG. 14 is a view illustrating positions and number of noise reduction modules disposed in an electronic device according to an embodiment of the disclosure.

Referring to FIGS. 13 and 14, a noise detection module 300 may detect noises N1, N2, N3, and N4 generated when an electronic device 400 is driven. For example, the noise detection module 300 may detect at least one of a first noise N1 including a friction sound caused by the friction generated from at least one of the motor core 431, motor rail 432, or gear 434 of the electronic device 400, a second noise N2 including a friction sound caused by the friction generated from at least one of the motor core 431, motor rail 432, or gear 434, electromagnetic noise generated from the coil of the motor core 431, and/or a third noise N3 caused by the friction generated between the articulated hinge structure 213 and the first slide rail 475, or a fourth noise N4 caused by the friction generated between the articulated hinge structure 213 and the second slide rail 485. The configuration of the noise detection module 300, the articulated hinge structure 213, the motor module 430, the first side cap portion 471, the first slide rail 475, the second side cap portion 481, and the second slide rail 485 may be identical in whole or part to the configuration of the noise detection module 260, the articulated hinge structure 213, the motor module 230, the first side cap portion 271, the first slide rail 275, the second side cap portion 281, and the second slide rail 285.

According to various embodiments, the electronic device 400 may include at least one noise detection module (e.g., the noise detection module 300 of FIG. 8). According to an embodiment, the at least one noise detection module may include a first noise detection module 302, a second noise detection module 304, a third noise detection module 306, or a fourth noise detection module 308. For example, although FIG. 14 illustrates the electronic device 400 including the first noise detection module 302, the second noise detection module 304, the third noise detection module 306, and the fourth noise detection module 308, the electronic device 400 may include the first noise detection module 302 alone, may include the first noise detection module 302 and the second noise detection module 304 alone, or may include the first noise detection module 302, the second noise detection module 304, and the third noise detection module 306 alone.

According to various embodiments, the noise detection module 300 may be disposed in a position capable of detecting noise N1, N2, N3, or N4. According to an embodiment, the first noise detection module 302 may be disposed adjacent to the first slide rail 475 to measure noise N3 caused by the friction between the articulated hinge structure 213 and the first slide rail 475. The first noise detection module 302 may be disposed adjacent to the first side cap portion 471 (e.g., the third sidewall 223c of FIG. 3) including the first external microphone hole 347a. For example, the microphone module (e.g., the microphone module 320 of FIG. 8) of the first noise detection module 302 may be connected to the first external microphone hole 347a. According to an embodiment, the second noise detection module 304 may be disposed adjacent to the second slide rail to measure noise N4 caused by the friction between the articulated hinge structure 213 and the second slide rail 485. The second noise detection module 304 may be disposed adjacent to at least a portion of a second side cap portion 481 (e.g., the second sidewall 223b of FIG. 3) including the second external microphone hole 347b. For example, the microphone module (e.g., the microphone module 320 of FIG. 8) of the second noise detection module 304 may be connected to the second external microphone hole 347b. According to an embodiment, the third noise detection module 306 may be disposed adjacent to the motor rail 432 to detect the second noise N2 generated from the motor module 430. According to an embodiment, the fourth noise detection module 308 may be disposed adjacent to the motor core 431 to detect the first noise N1 generated from the motor module 430. The configuration of the first external microphone hole 347a and the second external microphone hole 347b of FIG. 14 may be identical in whole or part to the configuration of the audio modules 247a and 247b of FIGS. 2 and 3.

Figure 15:
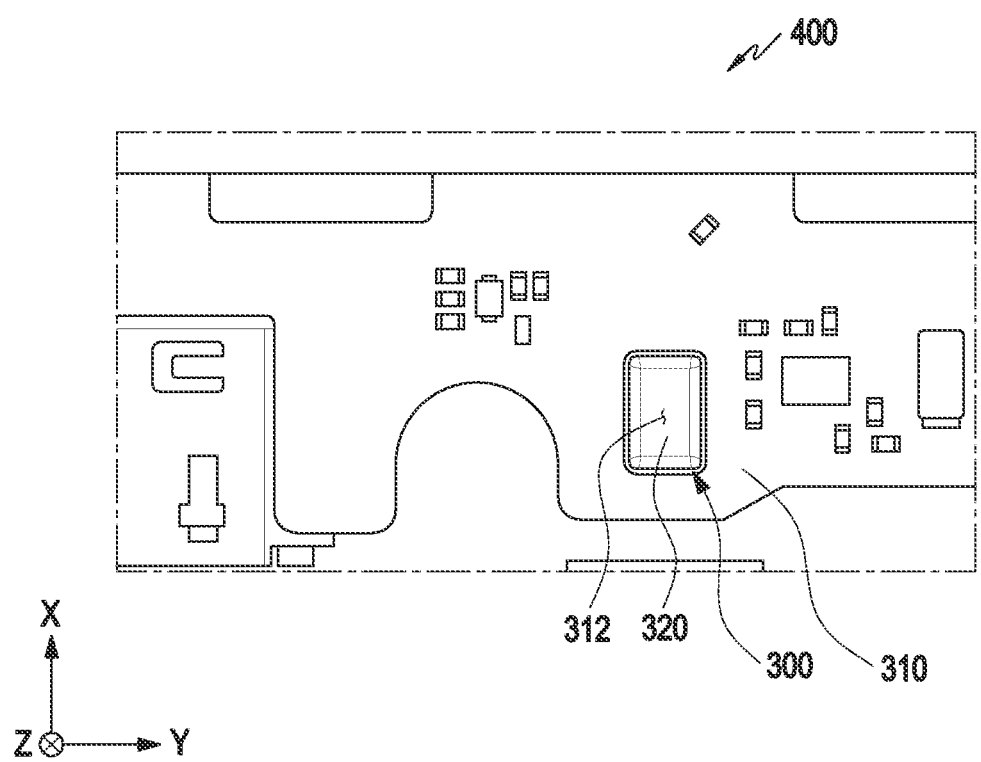
FIG. 15 is a front view illustrating a noise reduction module according to an embodiment of the disclosure.

FIG. 15 is a front view illustrating a noise detection module according to an embodiment of the disclosure.

Figure 16:
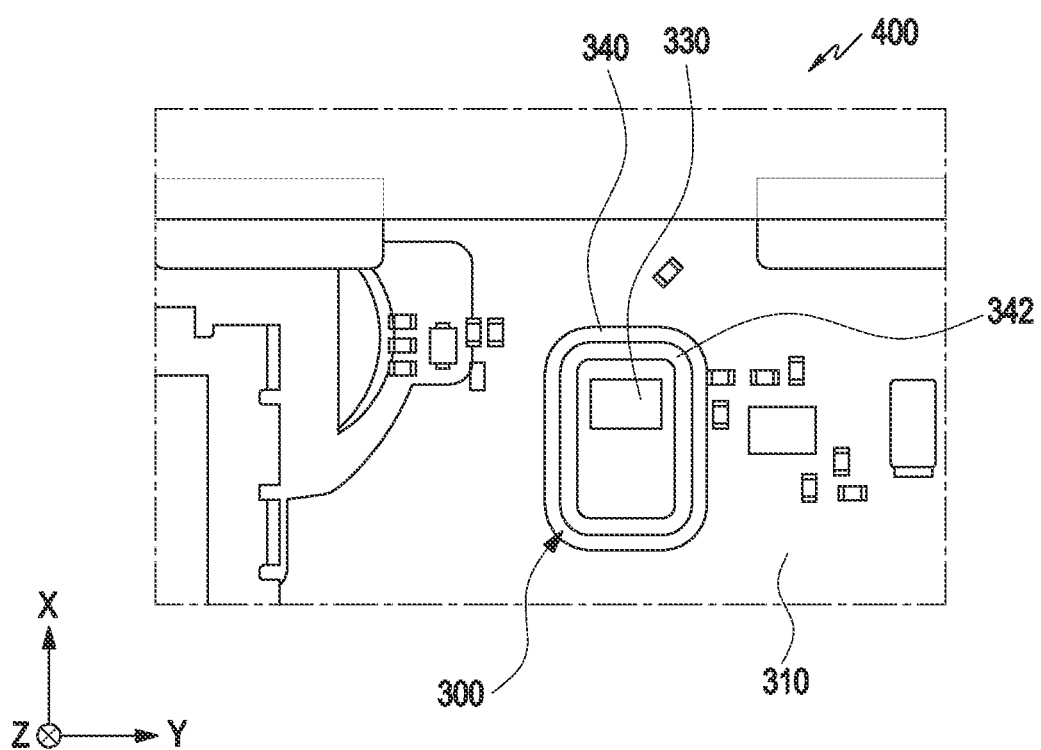
FIG. 16 is a front view illustrating a noise reduction module according to another embodiment of the disclosure.

FIG. 16 is a front view illustrating a noise detection module according to an embodiment of the disclosure.

Figure 17:
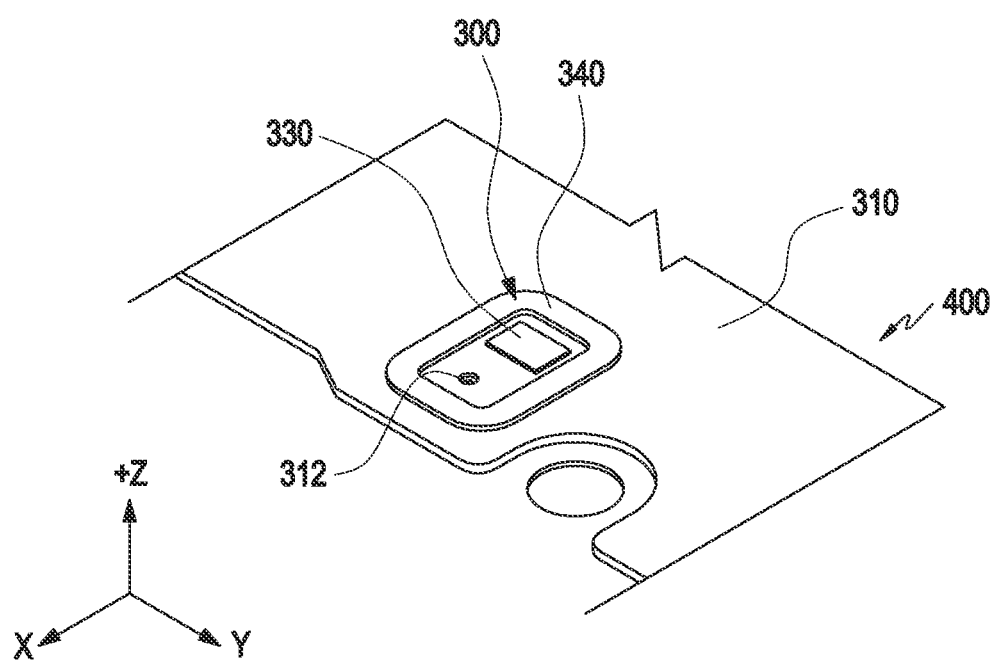
FIG. 17 is a rear perspective view illustrating the noise reduction module of FIG. 15 according to an embodiment of the disclosure.

FIG. 17 is a rear perspective view illustrating a noise detection module of FIG. 15 according to an embodiment of the disclosure.

Referring to FIGS. 15 to 17, a microphone module 320, a vibration detection sensor 330, and/or a shielding member 340 may be disposed on a first substrate surface 310a or a second substrate surface 310b of a substrate 310. The configuration of the substrate 310, the microphone module 320, the vibration detection sensor 330, and the shielding member 340 of FIGS. 15 to 17 may be identical in whole or part to the configuration of the substrate 310, the microphone module 320, the vibration detection sensor 330, and the shielding member 340 of FIG. 8.

According to various embodiments, the substrate 310, the microphone module 320, the vibration detection sensor 330, and the shielding member 340 of the noise detection module 300 may be disposed in various ways. According to an embodiment (e.g., FIGS. 15 and 17), the microphone module 320 may be disposed on the second substrate surface 310b of the substrate 310, and the vibration detection sensor 330 and the shielding member 340 may be disposed on the first substrate surface 310a of the substrate 310. According to an embodiment (e.g., FIG. 16), the microphone module 320 may be disposed on the first substrate surface 310a of the substrate 310, and the vibration detection sensor 330 and the shielding member 340 may be disposed on the second substrate surface 310b of the substrate 310. According to an embodiment (not shown), the microphone module 320, the vibration detection sensor 330, and the shielding member 340 may be disposed in the same direction with respect to the substrate 310. For example, the microphone module 320, the vibration detection sensor 330, and the shielding member 340 may be disposed on the first substrate surface 310a or the second substrate surface 310b of the substrate 310.

According to various embodiments, the substrate 310 may include a microphone hole 312 penetrating from the first substrate surface 310a to the second substrate surface 310b and connected to the microphone module 320. The vibration detection sensor 330 may be disposed apart from the microphone hole 312. For example, one end of the microphone hole 312 may be connected to the microphone module 320, and another end thereof may be exposed to the outside of the noise detection module 300. The shielding member 340 may surround at least a portion of the vibration detection sensor 330 and the microphone hole 312. According to an embodiment, the microphone hole 312 may be defined as an internal microphone hole.

Figure 18:
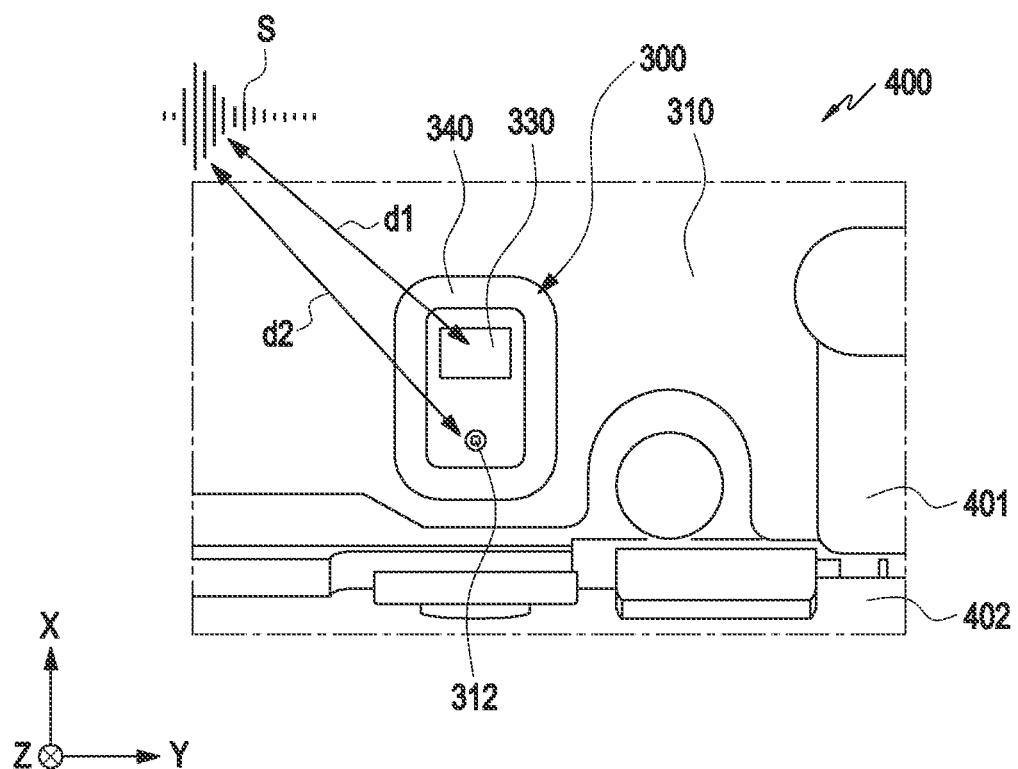
FIG. 18 is a view illustrating a positional relationship between a vibration detection sensor and a microphone hole according to an embodiment of the disclosure.

FIG. 18 is a view illustrating a positional relationship between a vibration detection sensor and a microphone hole according to an embodiment of the disclosure.

Referring to FIG. 18, an electronic device 400 may include a substrate 310, a microphone hole 312, a vibration detection sensor 330, a shielding member 340, a first housing 401, a second housing 402, and a noise generating structure S. According to an embodiment, the noise generating structure S may include at least one of the motor module 430, the articulated hinge structure 213, the first slide rail 475 or the second slide rail 485 of FIG. 13. The configuration of the substrate 310, the microphone hole 312, the vibration detection sensor 330, the shielding member 340, the electronic device 400, the first housing 401 and the second housing 402 of FIG. 18 may be identical in whole or part to the configuration of the substrate 310, the microphone hole 312, the vibration detection sensor 330, the shielding member 340, the electronic device 400, the first housing 401 and the second housing 402 of FIG. 10.

According to various embodiments, the vibration detection sensor 330 may be disposed more adjacent to the noise generating structure S than the microphone hole 312. For example, the distance d1 between the vibration detection sensor 330 and the noise generating structure S may be shorter than the distance d2 between the microphone hole 312 and the noise generating structure S. As the vibration detection sensor 330 is adjacent to the noise generating structure S, the accuracy of noise detection may be increased. According to an embodiment, the vibration detection sensor 330 may be positioned in a direction corresponding to the noise generating structure S. For example, if the noise generating structure S is positioned in a first direction (e.g., +Y direction) with respect to the noise detection module 300, the lengthwise (e.g., Y-axis direction) length of the shielding member 340 of the noise detection module 300 may be larger than the widthwise (e.g., X-axis direction) length, and the vibration detection sensor 330 may be positioned closer to the first direction (+Y direction) than the microphone hole 312.

FIGS. 19A, 19B, 19C, and 19D are front views illustrating an electronic device including a substrate including a through hole, according to various embodiments of the disclosure.

Referring to FIGS. 19A, 19B, 19C, and 19D, a substrate 310 may include at least one through hole 314 for reducing a resonance of noise (or vibration). In an embodiment, the substrate 310 including the through hole 314 may reflect at least a portion of noise (or vibration) and reduce echoes. For example, noise (or vibration) passing through the substrate 310 including the through hole 314 may reduce in the width of vibration, and the magnitude of irregular residual resonant frequencies may decrease. The configuration of the noise detection module 300 and the second housing 402 of FIGS. 19A, 19B, 19C, and 19D may be identical in whole or part to the configuration of the electronic device 400 and the second housing 402 of FIG. 10.

According to various embodiments, the resonant frequency of the substrate 310 may be changed based on at least one of the number and shape of through holes 314. For example, the resonance frequency of the substrate 310 may be changed based on a ratio of the volume of the through hole 314 to the volume of the substrate 310, and the magnitude of the vibration obtained in the noise detection module 300 may be changed. According to an embodiment, the substrate 310 may include a plurality of through holes 314 for optimizing vibration absorption. The plurality of through holes 314 may be formed in various sizes, shapes, or numbers.

According to various embodiments, the through hole 314 may be formed to surround at least a portion of the shielding member 340. According to an embodiment, at least some of the through holes 314 may be formed in portions of the substrate 310 adjacent to the shielding member 340. For example, at least some of the through holes 314 may be positioned between the noise generating structure (e.g., the noise generating structure S of FIG. 18) and the noise detection module 300. According to an embodiment, the through hole 314 may be spaced apart from the microphone hole 312. For example, when the noise detection module 300 is viewed from there above (e.g., in the Z-axis direction), one of the waterproofing member 350, the first adhesive member 360, or the second adhesive member 370 may overlap the microphone hole 312 but may not overlap the through hole 314.

Figure 19A:
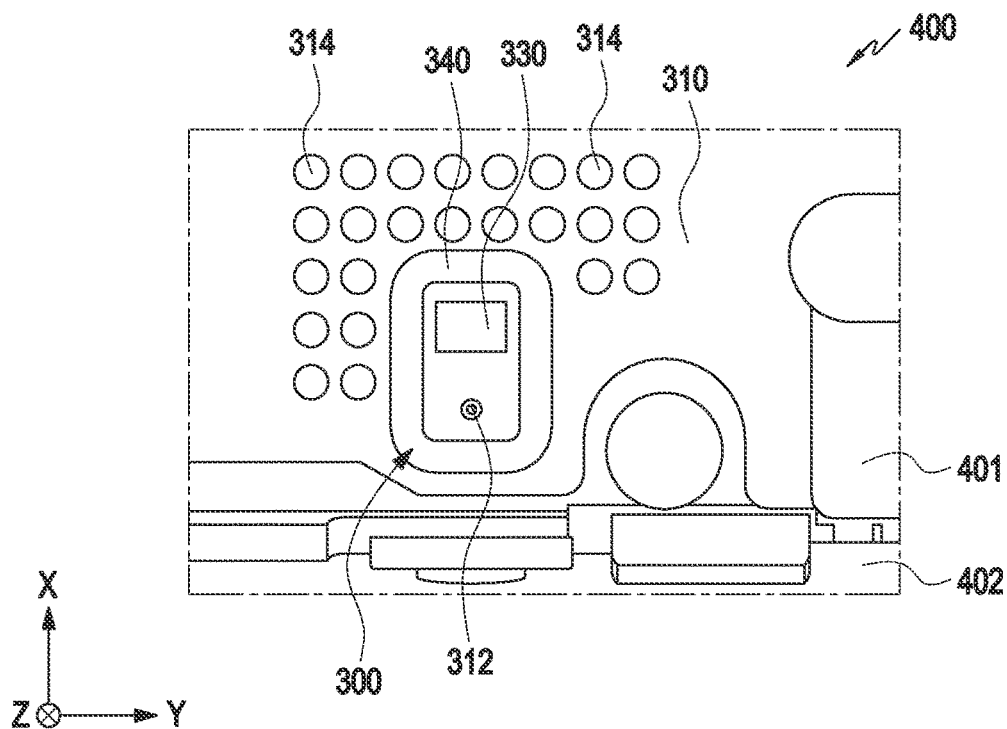
FIGS. 19A, 19B, 19C, and 19D are front views illustrating an electronic device including a substrate including a through hole, according to various embodiments of the disclosure.
Figure 19B:
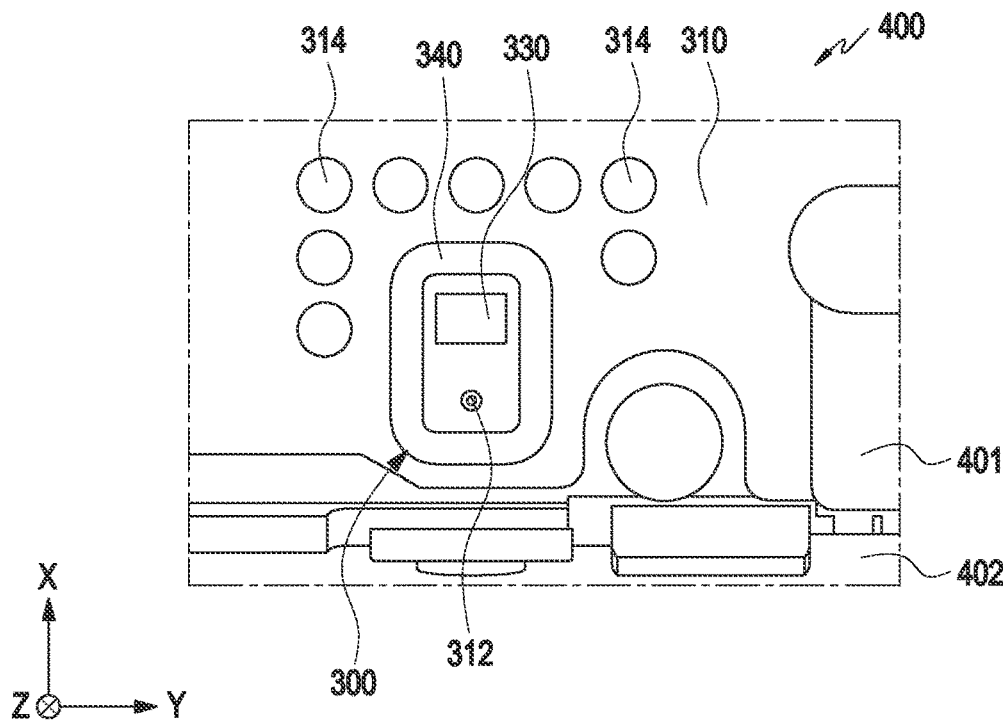
Figure 19C:
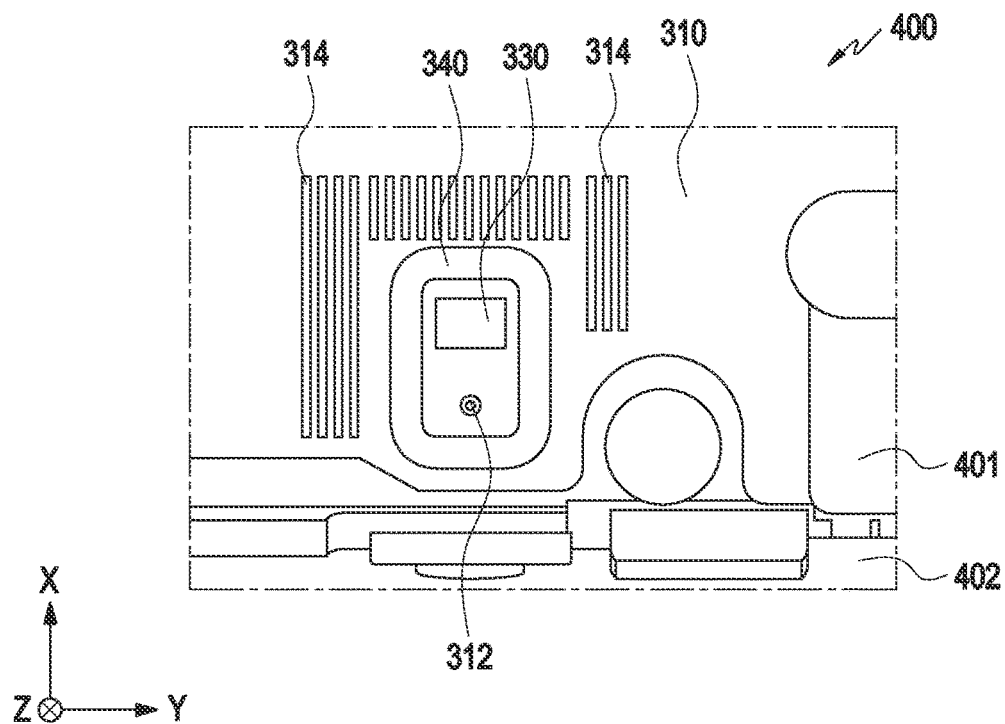
Figure 19D:
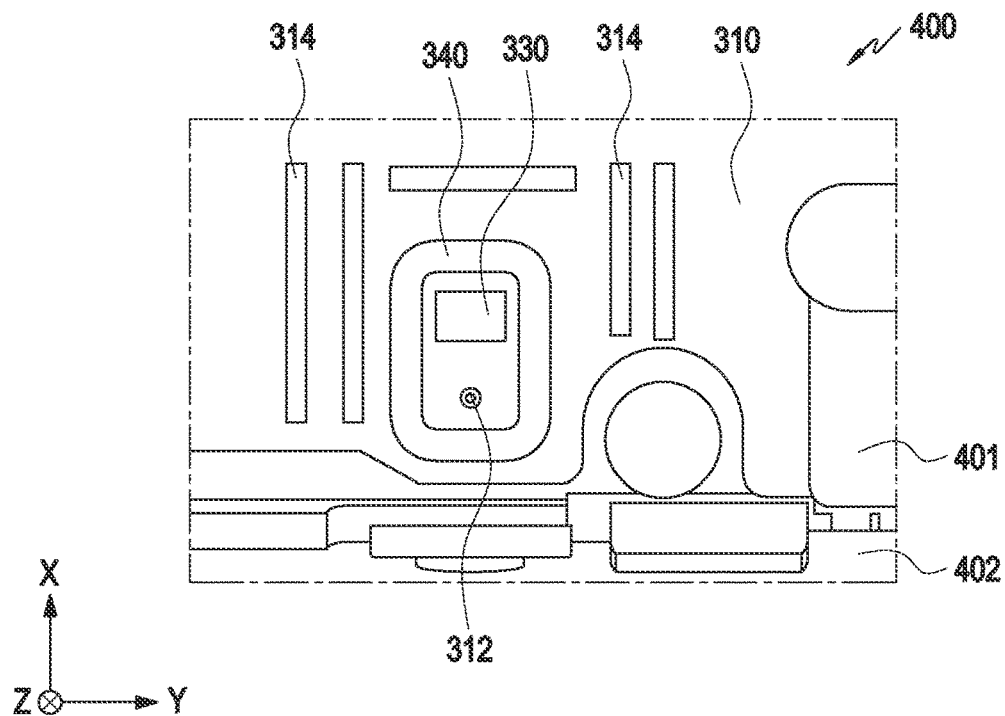

According to various embodiments, the through hole 314 may be formed in various shapes. Referring to FIGS. 19A and 19B, the through hole 314 may have a substantially circular cross section. Referring to FIGS. 19C and 19D, the through hole 314 may be formed in a slit shape.

Figure 20:
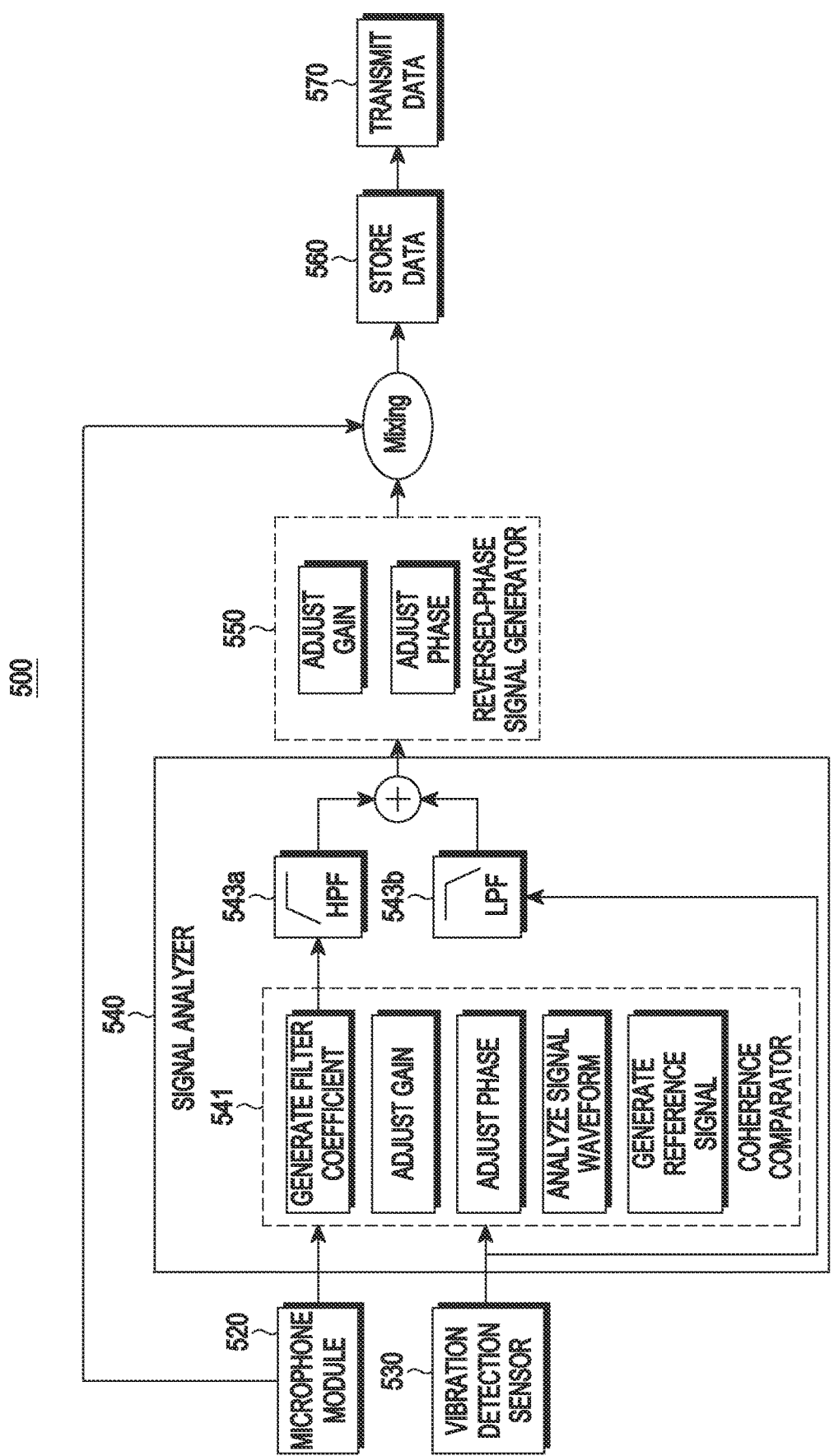
FIG. 20 is a block diagram illustrating a noise reduction operation according to an embodiment of the disclosure.

FIG. 20 is a block diagram illustrating a noise reduction operation according to an embodiment of the disclosure.

Figure 21:
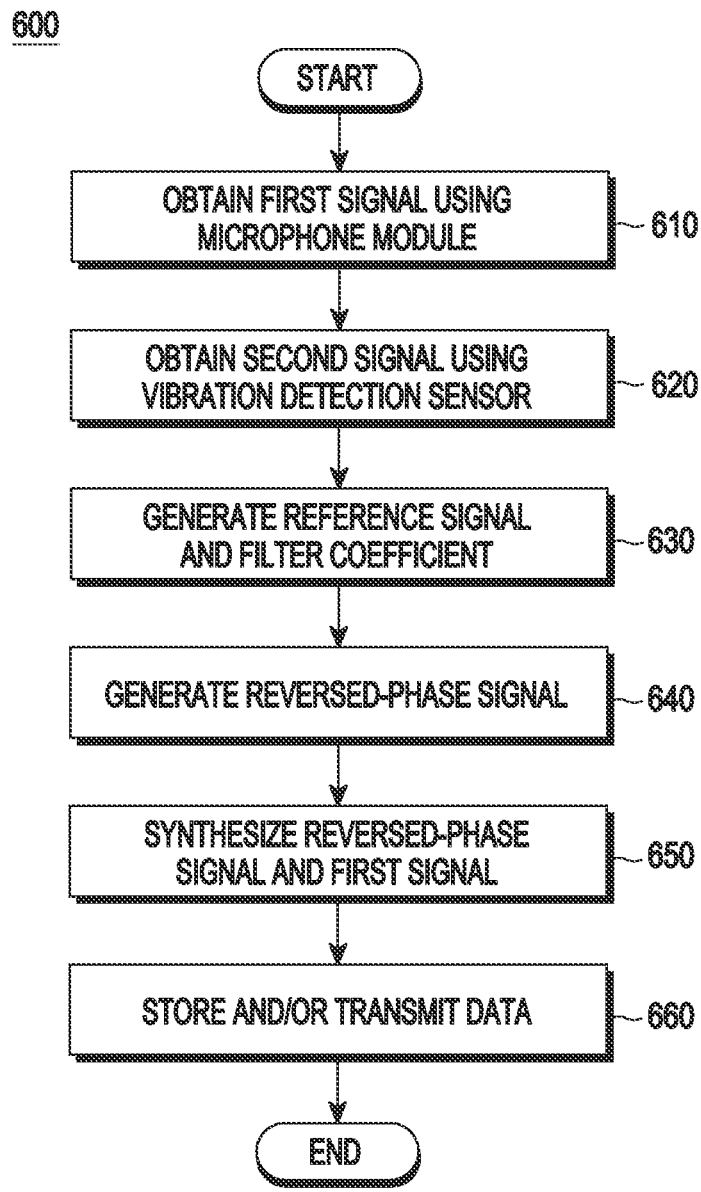
FIG. 21 is a flowchart illustrating a noise reduction operation according to an embodiment of the disclosure.

FIG. 21 is a flowchart illustrating a noise reduction operation according to an embodiment of the disclosure.

Referring to FIGS. 20 and 21, an electronic device 500 may perform a noise reduction operation 600 including an operation 610 of obtaining a first signal using a microphone module 520, an operation 620 of obtaining a second signal using a vibration detection sensor 530, an operation 630 of generating a reference signal and a filter coefficient using a signal analyzer 540, an operation 640 of generating an reversed-phase signal using an reversed-phase signal generator 550, an operation 650 of synthesizing an reversed-phase signal and a first signal, and/or an operation 660 of storing and/or transmitting a synthesized signal. The configuration of the electronic device 500, the microphone module 520, and the vibration detection sensor 530 of FIG. 20 may be identical in whole or part to the configuration of the electronic device 400, the microphone module 320, and the vibration detection sensor 530 of FIG. 9.

According to various embodiments, the electronic device 500 may perform the operation 610 of obtaining the first signal using the microphone module 520. The first signal may be generated based on vibration (e.g., sound) transferred through air and/or a solid medium.

According to various embodiments, the electronic device 500 may perform the operation 620 of obtaining the second signal by the vibration detection sensor 530. The second signal may be generated based on the vibration transferred through the solid medium. According to an embodiment, the operation 610 of obtaining the first signal using the microphone module 520 and the operation 620 of obtaining the second signal using the vibration detection sensor 530 may be performed substantially simultaneously.

According to various embodiments, the electronic device 500 may perform the operation 630 of generating at least one of a reference signal and a filter coefficient using the signal analyzer 540. According to an embodiment, the signal analyzer 540 may detect and extract noise based on the first signal obtained from the microphone module 520 and the second signal obtained from the vibration detection sensor 530. According to an embodiment, the signal analyzer 540 may include a coherence comparator 541 capable of generating the filter coefficient and reference signal based on the first signal and the second signal. The coherence comparator 541 may adjust the gain and/or phase of at least one of the first signal or the second signal. The coherence comparator 541 may analyze the waveform of the first signal and/or the second signal. According to an embodiment, the signal analyzer 540 may include a first filter unit 543a and/or a second filter unit 543b. For example, the first filter unit 543a, as a high pass filter (HPF), may remove or suppress a designated frequency component based on the generated filter coefficient. For example, the second filter unit 543b, as a low pass filter (LPF), may remove or suppress at least a portion of the second signal generated by the vibration detection sensor 530. According to an embodiment, the configuration of the signal analyzer 540 may be identical in whole or part to the configuration of the processor 120 of FIG. 1. For example, the processor 120 may execute software (e.g., the coherence comparator 541) to adjust the gain and/or phase of at least one of the first signal or the second signal. According to an embodiment, the coherence comparator 541 may be stored as software in a memory (e.g., the memory 130 of FIG. 1). According to an embodiment, the first signal obtained from the microphone module 520 and the second signal obtained from the vibration detection sensor 530 may be adjusted in the coherence comparator 541, the first filter unit 543a, and the second filter unit 543b and be transferred to the reversed-phase signal generator 550.

According to various embodiments, the electronic device 500 may perform the operation 640 of generating a reversed-phase signal by the reversed-phase signal generator 550. For example, the reversed-phase signal generator 550 may generate a reversed-phased signal of noise and/or vibration of a detected driving body (e.g., the noise generating structure S of FIG. 18). According to an embodiment, the reversed-phase signal generator 550 may generate a reversed-phase signal by adjusting at least one of the phase or gain of the signal adjusted in the coherence comparator 541, the first filter unit 543a, and the second filter unit 543b received from the signal analyzer 540. For example, the reversed-phase signal generator 550 may determine the reversed-phase of noise and/or vibration of the driving body (e.g., the noise generating structure S of FIG. 18) based on the filter coefficient and the reference signal generated by the signal analyzer 540 and the analyzed signal waveform. According to an embodiment, the configuration of the reversed-phase signal generator 550 may be identical in whole or part to the configuration of the processor 120 of FIG. 1. For example, the processor 120 may execute software (e.g., the reversed-phase signal generator 550) to perform the operation 640 of generating a reversed-phase signal. According to an embodiment, the reversed-phase signal generator 550 may be stored as software in a memory (e.g., the memory 130 of FIG. 1).

According to various embodiments, the electronic device 500 may perform the operation 650 (e.g., noise canceling) of synthesizing the reversed-phase signal and the first signal. For example, the electronic device 500 may combine the reversed-phase signal generated by the reversed-phase signal generator 550 and the first signal obtained from the microphone module 520, generating a third signal free from noise and/or vibration of the driving body (e.g., the noise generating structure S of FIG. 18). The third signal may be, e.g., a signal resultant from removing the reversed-phase signal from the first signal. According to an embodiment, when the electronic device 500 slides, noise of about 50 dB to about 60 dB may be generated due to a component (e.g., the motor module 230 of FIG. 4) of the electronic device 500. The electronic device 500 may generate a reversed-phase signal for canceling the noise by a noise detection module (e.g., the noise detection module 300 of FIG. 8). The magnitude of the noise may be reduced (e.g., about 15 dB to about 20 dB).

According to various embodiments, the electronic device 500 may include a data storage unit 560 and/or a data transmission unit 570. For example, the electronic device 500 may store data free from the noise and/or vibration of the driving body (e.g., the noise generating structure S of FIG. 18) and may transmit the data free from the noise and/or vibration of the driving body to the outside of the electronic device 500.

According to various embodiments of the disclosure, an electronic device (e.g., the electronic device 200 of FIG. 2) may comprise a housing (e.g., the first housing 201 or the second housing 202 of FIG. 2), a flexible display (e.g., the display 203 of FIG. 2) configured to move relative to at least a portion of the housing, and at least one noise detection module (e.g., the noise detection module 260 of FIG. 6) disposed in the housing. The at least one noise detection module may include a substrate (e.g., the substrate 310 of FIG. 8), a microphone module (e.g., the microphone module 320 of FIG. 8) disposed on the substrate, a vibration detection sensor (e.g., the vibration detection sensor 330 of FIG. 8) disposed on the substrate, a shielding member (e.g., the shielding member 340 of FIG. 8) disposed on the substrate and surrounding at least a portion of the vibration detection sensor, and a waterproofing member (e.g., the waterproofing member 350 of FIG. 8) disposed on the shielding member and covering the vibration detection sensor.

According to various embodiments, the substrate may include at least one through hole (e.g., the through hole 314 of FIG. 19A) formed to surround at least a portion of the shielding member.

According to various embodiments, the at least one noise detection module may include a first adhesive member (e.g., the first adhesive member 360 of FIG. 8) disposed between the shielding member and the waterproofing member.

According to various embodiments, the waterproofing member may include at least one waterproofing member opening (e.g., the waterproofing member opening 352 of FIG. 9) formed in a first length (e.g., the first length l1 of FIG. 9). The first adhesive member may include at least one first opening (e.g., the first opening 362 of FIG. 9) formed in a second length (e.g., the second length l2 of FIG. 9) larger than the first length.

According to various embodiments, the at least one noise detection module may include a second adhesive member (e.g., the second adhesive member 370 of FIG. 8) disposed between the waterproofing member and the housing.

According to various embodiments, the waterproofing member may include at least one waterproofing member opening (e.g., the waterproofing member opening 352 of FIG. 9) formed in a first length (e.g., the first length l1 of FIG. 9). The second adhesive member may include a second opening (e.g., the second opening 372 of FIG. 9) formed in a third length (e.g., the third length l3 of FIG. 9) larger than the first length.

According to various embodiments, the housing may include a first housing (e.g., the first housing 201 of FIG. 2) and a second housing (e.g., the second housing 202 of FIG. 2) receiving at least a portion of the first housing to guide a slide of the first housing. The flexible display may include a first display area (e.g., the first display area A1 of FIG. 4) mounted on the first housing and a second display area (e.g., the second display area A2 of FIG. 4) extending from the first display area. The electronic device may further comprise a roller (e.g., the roller 250 of FIG. 4) rotatably mounted to an edge of the second housing and configured to guide rotation of the second display area.

According to various embodiments, the electronic device may further comprise a motor module including a motor core (e.g., the motor core 231 of FIG. 6) for generating a driving force to slide the first housing and at least one gear (e.g., the gear 234 of FIG. 6).

According to various embodiments, the substrate may include a microphone hole (e.g., the microphone hole 312 of FIG. 18) connected with the microphone module. The vibration detection sensor may be closer to the motor module than the microphone hole.

According to various embodiments, the second housing may include a first side cap portion (e.g., the first side cap portion 471 of FIG. 14) including a first external microphone hole (e.g., the first external microphone hole 347a of FIG. 14) and a second side cap portion (e.g., the second side cap portion 481) including a second external microphone hole (e.g., the second external microphone hole 347b of FIG. 14). The at least one noise detection module may include a first noise detection module (e.g., the first noise detection module 302 of FIG. 14) connected with the first external microphone hole and a second noise detection module (e.g., the second noise detection module 304 of FIG. 14) connected with the second external microphone hole.

According to various embodiments, the substrate may include a first substrate surface (e.g., the first substrate surface 310a of FIG. 8) facing the shielding member and a second substrate surface (e.g., the second substrate surface 310b of FIG. 8) opposite to the first substrate surface. The vibration detection sensor may be disposed on the first substrate surface, and the microphone module may be disposed on the second substrate surface.

According to various embodiments, the substrate may include a first substrate surface (e.g., the first substrate surface 310a of FIG. 8) facing the shielding member and a second substrate surface (e.g., the second substrate surface 310b of FIG. 8) opposite to the first substrate surface. The vibration detection sensor and the microphone module may be disposed on the first substrate surface.

According to various embodiments, the shielding member may include a supporting area (e.g., the supporting area 344 of FIG. 8) surrounding the vibration detection sensor and a protruding area (e.g., the protruding area 342 of FIG. 8) protruding from the supporting area toward the substrate.

According to various embodiments, the electronic device may further comprise a processor (e.g., the processor 120 of FIG. 1) disposed in the housing. The processor may be configured to generate a reversed-phase signal based on a first signal obtained from the microphone module and a second signal obtained from the vibration detection sensor.

According to various embodiments, the processor may be configured to generate a third signal by synthesizing (e.g., mixing) the first signal and the reversed-phase signal.

According to various embodiments of the disclosure, a noise detection module (e.g., the noise detection module 300 of FIG. 8) may comprise a substrate (e.g., the substrate 310 of FIG. 8), a microphone module (e.g., the microphone module 320 of FIG. 8) disposed on the substrate, a vibration detection sensor (e.g., the vibration detection sensor 330 of FIG. 8) disposed on the substrate, a shielding member (e.g., the shielding member 340 of FIG. 8) disposed on the substrate and surrounding at least a portion of the vibration detection sensor, and a waterproofing member (e.g., the waterproofing member 350 of FIG. 8) disposed on the shielding member and covering the vibration detection sensor.

According to various embodiments, the substrate may include at least one through hole (e.g., the through hole 314 of FIG. 19A) surrounding at least a portion of the shielding member and a microphone hole (e.g., the microphone hole 312 of FIG. 10) connected with the microphone module.

According to various embodiments, the noise detection module may further comprise a first adhesive member (e.g., the first adhesive member 360 of FIG. 8) disposed between the shielding member and the waterproofing member and a second adhesive member (e.g., the second adhesive member 370 of FIG. 8) disposed in a direction opposite to the first adhesive member with respect to the waterproofing member.

According to various embodiments, the waterproofing member may include at least one waterproofing member opening (e.g., the waterproofing member opening 352 of FIG. 12) formed in a first length (e.g., the first length l1 of FIG. 12). The first adhesive member may include at least one first opening (e.g., the first opening 362 of FIG. 12) formed in a second length (e.g., the second length l2 of FIG. 12) larger than the first length. The second adhesive member may include at least one second opening (e.g., the second opening 372 of FIG. 12) formed in a third length (e.g., the third length l3 of FIG. 12) larger than the first length.

According to various embodiments, the shielding member may include a supporting area (e.g., the supporting area 444 of FIG. 8) surrounding the vibration detection sensor and a protruding area (e.g., the protruding area 442 of FIG. 8) protruding from the supporting area toward the substrate.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
   a housing;
   a flexible display configured to move relative to at least a portion of the housing; and
   at least one noise detection circuitry disposed in the housing,
   wherein the at least one noise detection circuitry comprises a substrate, a microphone circuitry disposed on the substrate, a vibration detection sensor disposed on the substrate, a shielding member disposed on the substrate and surrounding at least a portion of the vibration detection sensor, and a waterproofing member disposed on the shielding member and covering the vibration detection sensor.

2. The electronic device of claim 1, wherein the substrate comprises at least one through hole formed to surround at least a portion of the shielding member.

3. The electronic device of claim 1, wherein the at least one noise detection circuitry comprises a first adhesive member disposed between the shielding member and the waterproofing member.

4. The electronic device of claim 3,
   wherein the waterproofing member comprises at least one waterproofing member opening formed in a first length, and
   wherein the first adhesive member comprises at least one first opening formed in a second length larger than the first length.

5. The electronic device of claim 1, wherein the at least one noise detection circuitry comprises a second adhesive member disposed between the waterproofing member and the housing.

6. The electronic device of claim 5,
   wherein the waterproofing member comprises at least one waterproofing member opening formed in a first length, and
   wherein the second adhesive member comprises a second opening formed in a third length larger than the first length.

7. The electronic device of claim 1,
   wherein the housing comprises a first housing and a second housing receiving at least a portion of the first housing to guide a slide of the first housing,
   wherein the flexible display comprises a first display area mounted on the first housing and a second display area extending from the first display area, and
   wherein the electronic device further comprises a roller rotatably mounted to an edge of the second housing and configured to guide rotation of the second display area.

8. The electronic device of claim 7, further comprising a motor including a motor core for generating a driving force to slide the first housing and at least one gear.

9. The electronic device of claim 8,
   wherein the substrate comprises a microphone hole connected with the microphone circuitry, and
   wherein the vibration detection sensor is closer to the motor than the microphone hole.

10. The electronic device of claim 7,
    wherein the second housing comprises a first side cap portion including a first external microphone hole and a second side cap portion including a second external microphone hole, and
    wherein the at least one noise detection circuitry comprises a first noise detection circuitry connected with the first external microphone hole and a second noise detection circuitry connected with the second external microphone hole.

11. The electronic device of claim 1,
    wherein the substrate comprises a first substrate surface facing the shielding member and a second substrate surface opposite to the first substrate surface, and
    wherein the vibration detection sensor is disposed on the first substrate surface, and the microphone circuitry is disposed on the second substrate surface.

12. The electronic device of claim 1,
    wherein the substrate comprises a first substrate surface facing the shielding member and a second substrate surface opposite to the first substrate surface, and
    wherein the vibration detection sensor and the microphone circuitry are disposed on the first substrate surface.

13. The electronic device of claim 1, wherein the shielding member comprises a supporting area surrounding the vibration detection sensor and a protruding area protruding from the supporting area toward the substrate.

14. The electronic device of claim 1, further comprising:
a processor disposed in the housing,
wherein the processor is configured to generate a reversed-phase signal based on a first signal obtained from the microphone circuitry and a second signal obtained from the vibration detection sensor.

15. The electronic device of claim 14, wherein the processor is further configured to generate a third signal by synthesizing the first signal and the reversed-phase signal.

16. The electronic device of claim 14, wherein the substrate comprises at least one through hole configured to reduce vibration.

17. The electronic device of claim 14, wherein the at least one through hole is formed in a portion of the substrate adjacent to the shielding member.

18. The electronic device of claim 14, wherein the at least one through hole is formed in a portion of the substrate to surround at least a portion of the shielding member.

19. The electronic device of claim 15, wherein the processor is further configured to transmit the third signal.

* * * * *